US010784316B2

(12) United States Patent
Lee et al.

(10) Patent No.: US 10,784,316 B2
(45) Date of Patent: Sep. 22, 2020

(54) DISPLAY DEVICE HAVING DUMMY PATTERN IN NON-DISPLAY AREA

(71) Applicant: SAMSUNG DISPLAY CO. LTD., Yongin-si, Gyeonggi-Do (KR)

(72) Inventors: Ji Seon Lee, Yongin-si (KR); Moo Soon Ko, Yongin-si (KR); Young Woo Park, Yongin-si (KR); Se Wan Son, Yongin-si (KR); Jin Sung An, Yongin-si (KR); Min Woo Woo, Yongin-si (KR); Ju Won Yoon, Yongin-si (KR); Wang Woo Lee, Yongin-si (KR); Jeong Soo Lee, Yongin-si (KR); Deuk Myung Ji, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 10 days.

(21) Appl. No.: 16/148,436

(22) Filed: Oct. 1, 2018

(65) Prior Publication Data
US 2019/0229160 A1  Jul. 25, 2019

(30) Foreign Application Priority Data

Jan. 24, 2018 (KR) .................. 10-2018-0008989

(51) Int. Cl.
*H01L 51/00* (2006.01)
*H01L 27/32* (2006.01)
(52) U.S. Cl.
CPC ...... *H01L 27/3223* (2013.01); *H01L 27/3276* (2013.01); *H01L 51/0097* (2013.01); *H01L 2251/5338* (2013.01)

(58) Field of Classification Search
CPC ............... H01L 27/124; H01L 27/3276; H01L 2251/5338; H01L 27/1288; H01L 51/5246
See application file for complete search history.

(56) References Cited

U.S. PATENT DOCUMENTS 8,059,076 B2  11/2011  Jung et al.
9,342,177 B2   5/2016  Seo et al.
(Continued)

FOREIGN PATENT DOCUMENTS

KR     10-0482343    3/2005
KR     10-1316635    10/2013
(Continued)

*Primary Examiner* — Jaehwan Oh
(74) *Attorney, Agent, or Firm* — F. Chau & Associates, LLC

(57) ABSTRACT

A display device includes a substrate including a display area and a non-display area. First, second, and third insulating layers are sequentially disposed on the substrate. Pixels are disposed in the display area. Each of the pixels including a transistor and a light emitting element connected to the transistor. A data line is disposed in the display area. The data line is configured to supply a data signal to each of the plurality of pixels. A wiring portion is disposed in the non-display area. The wiring portion includes a connecting line connected to the data line and a fan-out line connected to the connecting line. A dummy pattern is disposed in the non-display area. The dummy pattern at least partially overlaps the wiring portion.

32 Claims, 13 Drawing Sheets

(56) References Cited

U.S. PATENT DOCUMENTS

| | | | | |
|---|---|---|---|---|
| 2002/0163611 | A1* | 11/2002 | Kamijima | H01L 51/525 349/122 |
| 2005/0078240 | A1* | 4/2005 | Murade | G02F 1/136209 349/110 |
| 2005/0248708 | A1* | 11/2005 | Park | G02F 1/133351 349/149 |
| 2008/0204434 | A1* | 8/2008 | Lee | G02F 1/1345 345/205 |
| 2010/0187538 | A1* | 7/2010 | Koo | H01L 27/124 257/72 |
| 2013/0248869 | A1* | 9/2013 | Chang | G02F 1/136227 257/59 |
| 2014/0030894 | A1* | 1/2014 | Shin | H01L 21/308 438/703 |
| 2016/0217746 | A1 | 7/2016 | An et al. | |
| 2016/0315284 | A1* | 10/2016 | Jeon | H01L 51/5256 |
| 2016/0321992 | A1* | 11/2016 | Kim | G09G 3/3225 |
| 2016/0334657 | A1* | 11/2016 | Jeon | G02F 1/133345 |
| 2017/0192580 | A1* | 7/2017 | Jung | G02F 1/134363 |
| 2017/0194411 | A1* | 7/2017 | Park | H01L 51/5262 |
| 2018/0294199 | A1* | 10/2018 | Wu | G02F 1/1345 |

FOREIGN PATENT DOCUMENTS

| | | |
|---|---|---|
| KR | 10-2016-0092154 | 6/2016 |
| KR | 10-1641690 | 7/2016 |

* cited by examiner

DISPLAY DEVICE HAVING DUMMY PATTERN IN NON-DISPLAY AREA

CROSS REFERENCE TO RELATED APPLICATION

This application claims priority to and the benefit of Korean Patent Application No. 10-2018-0008989, filed on Jan. 24, 2018 in the Korean Intellectual Property Office (KIPO), the disclosure of which is hereby incorporated by reference herein in its entirety.

TECHNICAL FIELD

The present disclosure relates to a display device and, more specifically, to a display device having a dummy pattern in a non-display area thereof.

DISCUSSION OF THE RELATED ART

A display device includes a plurality of pixels for displaying an image and each of the pixels includes a plurality of transistors, a capacitor, and a wiring portion connected to the transistors to drive a display element thereof. The configurations in each pixel may be formed by a photolithographic process that exposes a pattern in photoresist through a mask.

As the pattern within the display area of the display device is significantly denser than the pattern within the non-display area, the resulting differences in the photoresist pattern may cause a significant density difference between a display area, where the plurality of pixels are disposed, and a non-display area, where the pixels are not disposed. In particular, in the non-display area. Where the photoresist pattern is arranged at a low density, the amount of the photoresist dissolved in the developing process may be larger than that in the display area, where the photoresist pattern is arranged at a higher density. Therefore, a concentration of the developing solution applied on the non-display area may be significantly lower than on the display area and an abrupt concentration difference may be present between the developing solution on the display area and the developing solution on the non-display area.

Such a difference in the concentration may cause uneven thickness of the photoresist pattern within each area.

SUMMARY

A display device includes a substrate including a display area and a non-display area. A first insulating layer is disposed on the substrate. A second insulating layer is disposed on the first insulating layer. A third insulating layer is disposed on the second insulating layer. A plurality of pixels is disposed in the display area. Each of the plurality of pixels includes at least one transistor and a light emitting element connected to the at least one transistor. A data line is disposed in the display area. The data line is configured to supply a data signal to each of the plurality of pixels. A wiring portion is disposed in the non-display area. The wiring portion includes a connecting line connected to the data line and a fan-out line connected to the connecting line. A dummy pattern is disposed in the non-display area. The dummy pattern at least partially overlaps a part of the wiring portion.

A display device includes a substrate including a display area and a non-display area. A first insulating layer is disposed on the substrate. A second insulating layer is disposed on the first insulating layer. A third insulating layer is disposed on the second insulating layer. A plurality of pixels is disposed in the display area. Each of the plurality of pixels includes at least one transistor and a light emitting element connected to the at least one transistor. A plurality of data lines is disposed in the display area. The plurality of data lines is configured to supply a data signal to each of the plurality of pixels. A wiring portion is disposed in the non-display area. The wiring portion includes a plurality of connecting lines connected to corresponding data lines of the plurality of data lines. A first fan-out line is connected to a corresponding connecting line of the plurality of connecting lines. A second fan-out line is connected to a corresponding connecting line of the plurality of connecting lines. The first and second fan-out lines are disposed on different layers. A dummy pattern is disposed in the non-display area. The dummy pattern at least partially overlaps the wiring portion. The dummy pattern includes a dummy active pattern at least partially overlapping the connecting lines, a first dummy line at least partially overlapping the first fan-out line, and a second dummy line at least partially overlapping the second fan-out line.

A display device includes a substrate having a display area and a non-display area. A plurality of pixels is disposed on the display area. A data line is disposed in the display area. The data is line is configured to supply a data signal to each of the plurality of pixels. A wiring portion is disposed in the non-display area. The wiring portion includes a connecting line connected to the data line and a fan-out line connected to the connecting line. A dummy pattern is disposed in the non-display area. The dummy pattern at least partially overlaps the wiring portion. The display area has a first pattern density. The non-display area has a second pattern density. The first pattern density is substantially equal to the second pattern density.

BRIEF DESCRIPTION OF THE DRAWINGS

A more complete appreciation of the present disclosure and many of the attendant aspects thereof will be readily obtained as the same becomes better understood by reference to the following detailed description taken in conjunction with the accompanying drawings, in which.

DETAILED DESCRIPTION OF EMBODIMENTS

Figure 1:
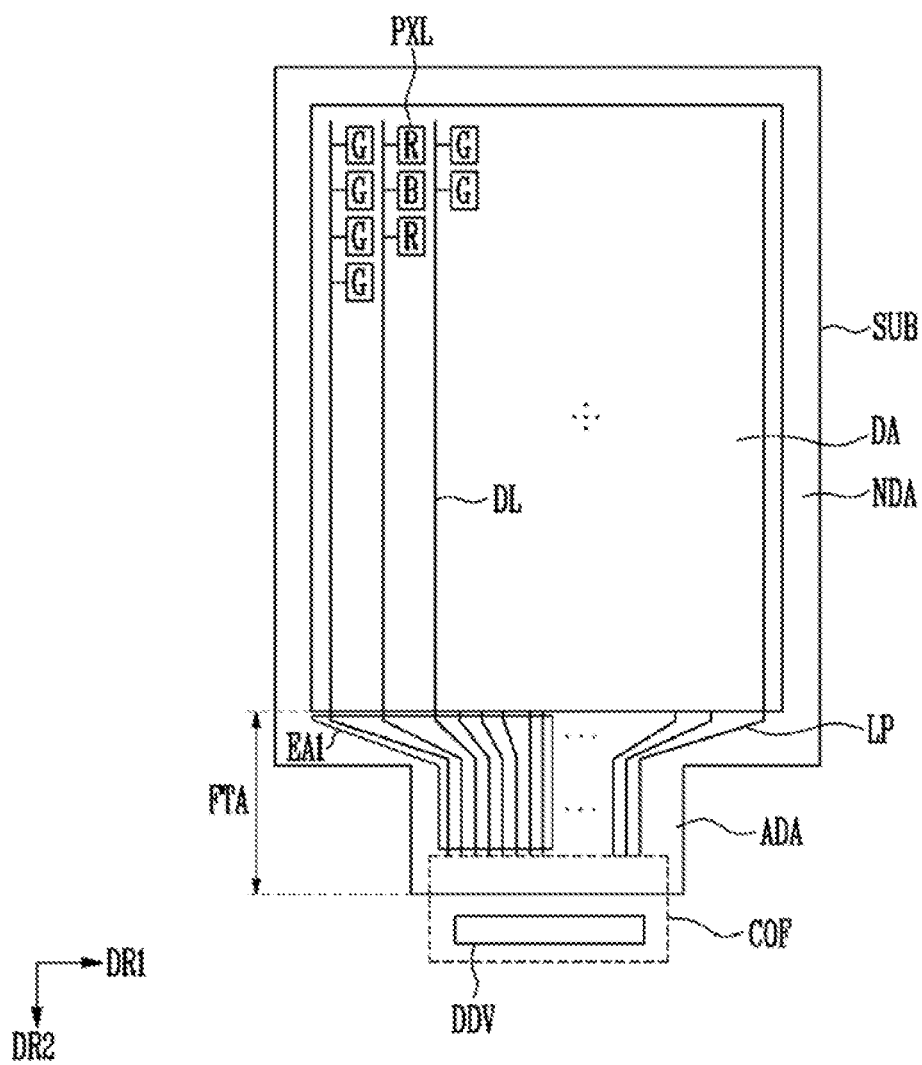
FIG. 1 is a plan view illustrating a display device according to exemplary embodiments of the present disclosure.

A more complete appreciation of the present disclosure and many of the attendant aspects thereof will be readily obtained as the same becomes better understood by reference to the following detailed description when considered in connection with the accompanying drawings. The inventive concept may, however, be embodied in many different forms and should not be construed as limited to the exemplary embodiments set forth herein. It is to be understood that the invention is intended to cover all modifications, equivalents, and alternatives falling within the spirit and scope of the present disclosure.

Like reference numerals may represent similar elements in the description and the drawings. In the drawings, the sizes and relative sizes of layers and regions may be exaggerated for clarity. It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments. As used herein, the singular forms "a," "an" and "the" are intended to include the plural forms as well, unless the context clearly indicates otherwise.

Figure 2:
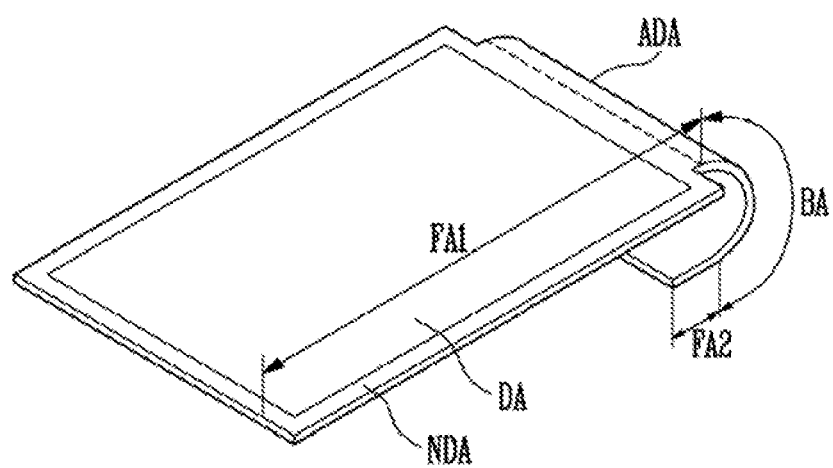
FIG. 2 is a perspective view illustrating an example of the display device of FIG. 1.

FIG. 1 is a plan view illustrating a display device according to exemplary embodiments of the present disclosure. FIG. 2 is a perspective view illustrating an example of the display device of FIG. 1.

Referring to FIGS. 1 and 2, the display device may include a substrate SUB, a plurality of pixels PXL disposed on the substrate SUB, a wiring portion LP connected to the pixels PXL, and a driving circuit board connected to the wiring portion LP.

The substrate SUB may include a display area DA and a non-display area disposed on at least one side of the display area DA.

The substrate SUB may have a substantially rectangular shape. In some exemplary embodiments of the present disclosure, the substrate SUB may include a pair of shorter sides that are parallel to each other and extend in a first direction DR1 and a pair of longer sides that are parallel to each other and extend in a second direction DR2.

However, the shape of the substrate SUB may be different than as described herein, and the substrate SUB may have various other shapes. For example, the substrate SUB may have a closed polygon shape including straight sides, a circle, a semi-circle, a semi-ellipse, or the like. In some exemplary embodiments of the present disclosure, when the substrate SUB has straight sides, at least some of the corners may be curved. For example, when the substrate SUB has a rectangular shape, a portion where adjacent straight sides meet may be replaced by a curve having a predetermined curvature. This shape may be referred to as a rounded rectangle. For example, the vertex portions of the rectangular shape may be formed of curved sides connected to two straight sides adjacent to each other and having a predetermined curvature. The predetermined curvature may be set differently depending on the position. For example, the curvature may vary depending on the position at which the curve starts and the length of the curve.

The display area DA may be an area where the pixels PXL are disposed. The display area DA may be capable of displaying an image. The display area DA may be disposed in a shape corresponding to the shape of the substrate SUB. For example, the display area DA may include a closed polygon including straight sides, a circle, an ellipse, etc., a semi-circle, a semi-ellipse, or the like. In some exemplary embodiments of the present disclosure, when the display area DA has straight sides, at least some of the corners may be curved to form a rounded rectangle.

The pixels PXL may be disposed in the display area DA of the substrate SUB. Each of the pixels PXL may be a minimum unit for displaying an image. Each of the pixels PXL may emit white light and/or a colored light. Each pixel PXL may emit one of red, green, blue, and white colors. However, the pixels may emit different colors such as cyan, magenta, and yellow.

Each of the pixels PXL may be a light emitting element including an organic light emitting layer. However, the pixels PXL are not limited thereto. For example, the pixels PXL may be embodied in various forms such as a liquid crystal element, an electrophoretic element, an electro wetting element, or the like.

In some exemplary embodiments of the present disclosure, the pixels PXL may be arranged in a matrix form including rows extending in the first direction DR1 and columns extending in the second direction DR2. However, the arrangement of the pixels PXL is not limited thereto, and the pixels PXL may be arranged in various other forms. For example, the pixels PXL may be arranged such that a row direction is oblique with respect to the column direction.

The pixels PXL may include a first type of pixels G for displaying green, second type of pixels R for displaying red, and third type of pixels B for displaying blue.

The first pixels G may be arranged in the second direction DR2 to form a first pixel column. The second pixels R and the third pixels B may be alternately arranged in the second direction DR2 to form a second pixel column. The first pixel column and the second pixel column may be provided in plurality and alternately arranged along the first direction DR1. Each pixel column may be connected to a data line DL.

The arrangement structure of the first, second, and third pixels G, R, and B may correspond to a pentile matrix pixel PXL structure. The pentile matrix pixel PXL structure applies a rendering operation that shares the adjacent pixels PXL and expresses color, so that a desired resolution may be achieved with a smaller number of pixels PXL.

In some exemplary embodiments of the present disclosure, the first pixel G, the second pixel R, and the third pixel B have a same area, but according to other approaches, the different types of pixels may have different areas.

The wiring portion LP may be disposed in the non-display area NDA and may be connected to the pixels PXL. The wiring portion LP may supply a signal to each pixel and may include a fan-out line connected to the data line DL and a power line configured for applying power to each pixel PXL of the display area DA. The wiring portion LP may further include other lines as required.

In some exemplary embodiments of the present disclosure, the non-display area NDA may further include an additional area ADA protruding from a part thereof. The additional area ADA may protrude from the sides of the non-display area NDA. The additional area ADA may be a fan-out area FTA. The wiring portion LP electrically connected to the data line DL disposed in each pixel PXL may be provided in the fan-out area FTA.

A driver may be mounted on the driving circuit board. The driver may supply a signal to each pixel PXL through the wiring portion LP. The driver may include a gate driver for providing a scan signal to each pixel PXL, a data driver DDV for providing a data signal to each pixel PXL along the data line DL, a timing controller for controlling the gate driver and the data driver DDV, and the like.

The driving circuit board may include a chip on film COF connected to the substrate SUB and a printed circuit board connected to the COF.

The COF may process various signals input from the printed circuit board and output the processed signals to the substrate SUB. One end of the COF may be attached to the substrate SUB and the other end of the COF may be attached to the printed circuit board.

The data driver DDV may be directly mounted on the substrate SUB but the data driver DDV may alternatively be mounted elsewhere. For example, the data driver DDV may be formed on a separate chip and connected to the substrate SUB. In some exemplary embodiments of the present disclosure, the data driver DDV may be formed on a separate chip and then mounted on the COF. The data signal of the data driver DDV may be applied to the data line DL of the display area DA through the wiring portion LP.

In some exemplary embodiments of the present disclosure, at least a part of the display device may be flexible and/or foldable. For example, the display device may include the bent area BA and flat areas FA1 and FA2 which are disposed on at least one side of the bent area BA and are flat and unfolded. The flat areas FA1 and FA2 may either be flexible or rigid.

In some exemplary embodiments of the present disclosure, the bent area BA is shown as being disposed in the additional area ADA. The flat areas FA1 and FA2 may include a first flat area FA1 and a second flat area FA2 which are spaced apart from each other with the bent area BA therebetween. The first flat area FA1 may include the display area DA. Therefore, the bent area BA may be spaced from the display area DA.

When a line folded by the display device is referred to as a folding line, the folding line may be disposed in the bent area BA. The terms "folded" or "foldable" as used herein are intended to mean that the shape is not fixed, but may be modified from its original shape to another shape, and may be folded along one or more specific lines (e.g., the folding line), curved, or roiled. As shown in FIG. 2, the display device may be folded so that the two flat areas FA1 and FA2 are parallel to each other and face each other. However, the folded state of the flat areas FA1 and FA2 can be otherwise arranged. For example, the display device may be folded so that faces of the two flat areas FA1 and FA2 may be at a predetermined angle (e.g., an acute angle, a right angle, or an obtuse angle) with the bent area BA interposed therebetween.

In some exemplary embodiments of the present disclosure, the additional area ADA may be bent along the folding line, whereby a width of the bezel of the display device may be reduced, as seen from a plan view.

Figure 3:
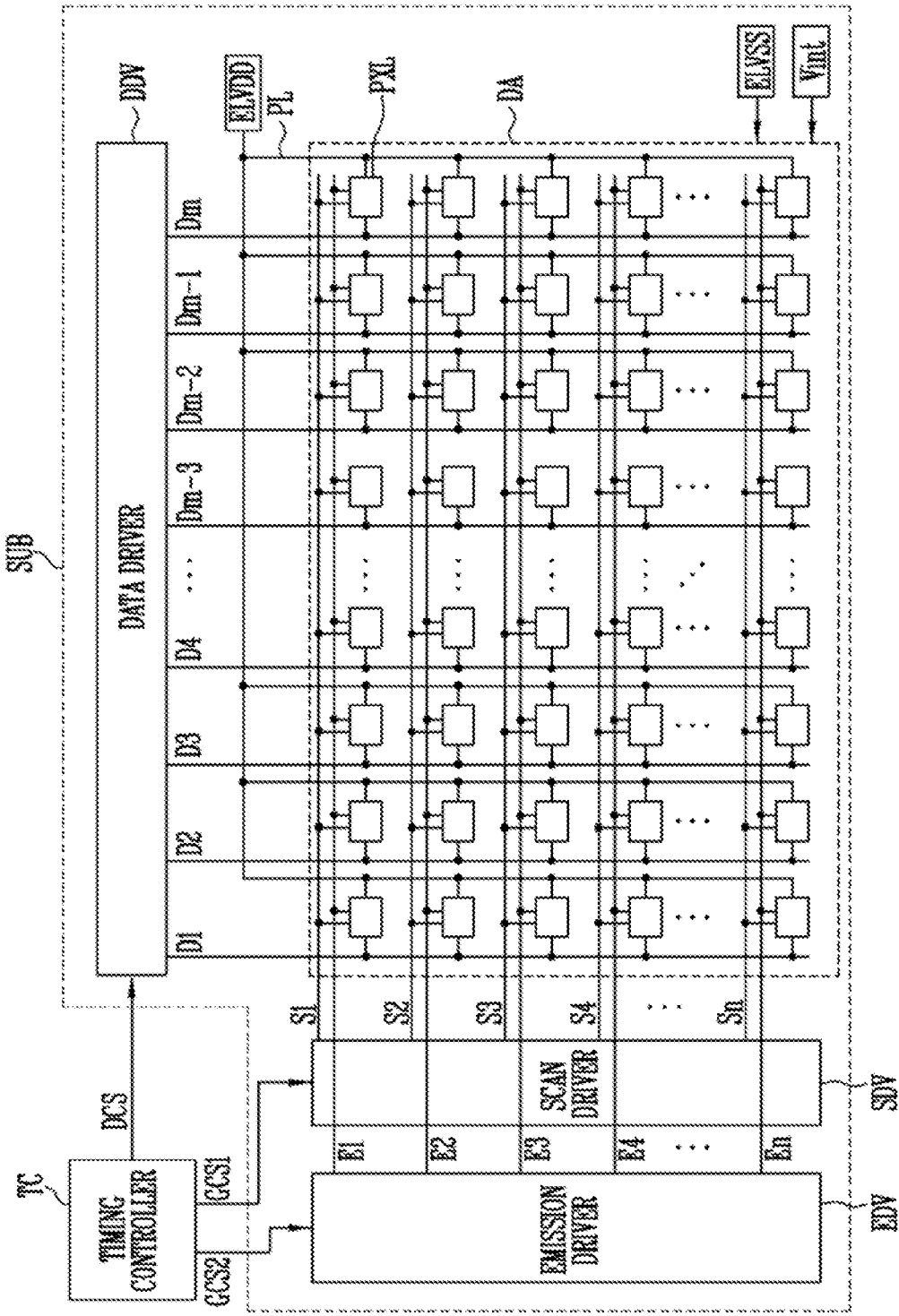
FIG. 3 is a block diagram illustrating an example of a plurality of pixels and a driver included in the display device of FIG. 1.

FIG. 3 is a block diagram illustrating an example of a plurality of pixels and a driver included in the display device of FIG. 1.

Referring to FIGS. 1 and 3, the display device may include the pixels PXL, a driver, and a wiring portion.

The driver may include a scan driver SDV, an emission driver EDV, the data driver DDV, and a timing controller TC. In FIG. 3, the positions of the scan driver SDV, the emission driver EDV the data driver DDV, and the timing controller TC are shown in one possible configuration. In an implementation of the display device, each driver may be disposed at other positions within the display device.

The wiring portion may be disposed in the display area DA and may include a plurality of scan lines S1 to Sn, a plurality of data lines D1 to Dm, emission control lines E1 to En, a power line PL, and an initialization power line for providing signals to the pixels PXL from the driver.

The pixels PXL may be disposed in the display area DA. Each pixel PXL may receive a data signal form a corresponding data line when a scan signal is applied to a corresponding scan line. The pixel PXL receiving the data signal may control a current flowing from a first power source ELVDD provided through the power line PL to a second power source ELVSS via a light emitting element.

The scan driver SDV may apply the scan signals to the scan lines S1 to Sn in response to a first gate control signal GCS1 from the timing controller TC. For example, the scan driver SDV may sequentially apply the scan signals to the scan lines S1 to Sn. When the scan signals are sequentially supplied to the scan lines S1 to Sn, the pixels PXL may be sequentially selected in units of horizontal lines.

The emission driver EDV may apply the emission control signal to the emission control lines E1 to En in response to a second gate control signal GCS2 from the timing controller TC. For example, the emission driver EDV may sequentially supply the emission control signals to the emission control lines E1 to En.

The emission control signal may be set wider than the scan signal. For example, at least a part of the emission control signal supplied to an i-th (where "i" is a natural number) emission control line Ei may overlap the scan signal supplied to an (i−1)-th scan line Si−1 and an i-th scan line Si. In addition, the emission control signal may be set to a gate off voltage (e.g., a high voltage) so that the transistors included in the pixels PXL may be turned off, and the scan signal may be set to a gate on voltage (e.g., a low voltage) so that the included transistors may be turned on.

The data driver DDV may apply the data signals to the data lines D1 to Dm in response to a data control signal DCS. The data signals supplied to the data lines D1 to Dm may be supplied to the pixels PXL selected by the scan signals.

The timing controller TC may apply the gate control signals GCS1 and GCS2 generated based on externally supplied timing signals to the scan driver SDV and the emission driver EDV, and may apply the data control signal DCS to the data driver DDV.

Each of the gate control signals GCS1 and GCS2 may include a start pulse and clock signals. The start pulse controls a timing of the first scan signal or the first emission control signal. The clock signals are used to shift the start pulse.

The data control signal DCS may include a source start pulse and clock signals. The source start pulse may control a sampling start time of the data, and the clock signals may be used to control the sampling operation.

Figure 4:
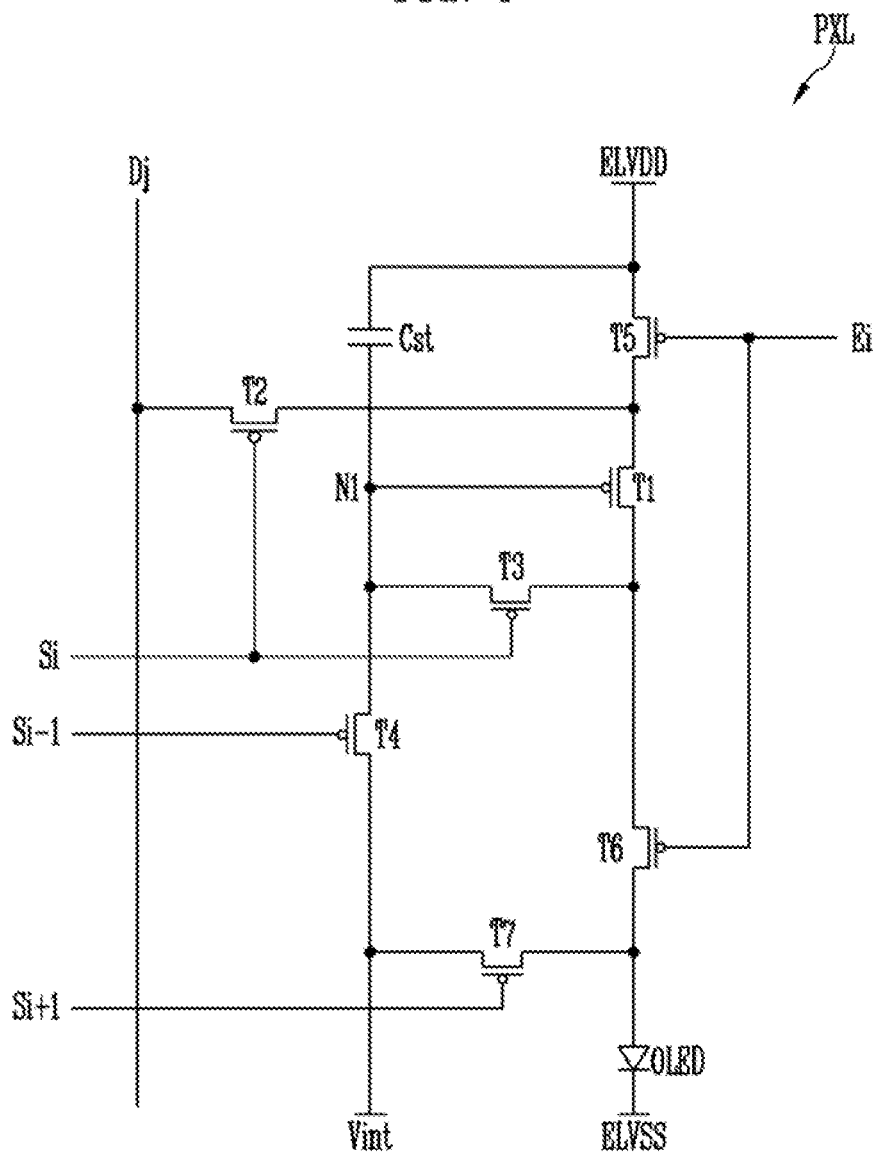
FIG. 4 is an equivalent circuit diagram illustrating an example of a pixel among the pixels of FIG. 3.

FIG. 4 is an equivalent circuit diagram illustrating an example of a pixel among the pixels of FIG. 3. For convenience of description, a pixel connected to a j-th data line Dj, a (i−1)-th scan line Si−1, a i-th scan line Si, and a (i+1)-th scan line Si+1 will be illustrated in FIG. 4.

Referring to FIGS. 3 and 4, the pixels PXL may include a light emitting element OLED, first to seventh transistors T1 to T7, and a storage capacitor Cst.

An anode electrode of the light emitting element OLED may be connected to the first transistor T1 via the sixth transistor T6 and a cathode electrode of the light emitting element OLED may be connected to the second power source ELVSS. The light emitting element OLED may generate light having a predetermined luminance corresponding to an amount of current supplied from the first transistor T1. The first power source ELVDD applied to the power line PL may be set to a voltage higher than the second power source ELVSS so that a current may flow through the light emitting element OLED.

A source electrode of the first transistor T1 (e.g. a driving transistor) may be connected to the first power source ELVDD via the fifth transistor T5. A drain electrode of the first transistor T1 may be connected to the anode electrode of the light emitting element OLED. The first transistor T1 may control the current flowing from the first power source ELVDD to the second power source ELVSS via the light emitting element OLED in response to a voltage of a first node N1 (e.g., a gate electrode of the first transistor).

The second transistor T2 (e.g. a switching transistor) may be connected between a j-th data line Dj and the source electrode of the first transistor T1. A gate electrode of the second transistor T2 may be connected to the i-th scan line Si. The second transistor T2 may be turned on to electrically connect the j-th data line Dj to the source electrode of the first transistor T1 when a scan signal is applied to the i-th scan line. Si.

The third transistor T3 may be connected between the drain electrode of the first transistor T1 and the first node N1. A gate electrode of the third transistor T3 may be connected to the i-th scan line Si. The third transistor T3 may be turned on to electrically connect the drain electrode of the first transistor T1 to the first node N1 when a scan signal is supplied to the i-th scan line Si. Therefore, when the third transistor T3 is turned on, the first transistor T1 may have a diode-connected state.

The fourth transistor T4 may be connected between the first node N1 and an initialization power source Vint. A gate electrode of the fourth transistor T4 may be connected to the (i−1)-th scan line Si−1. The fourth transistor T4 may be turned on to transmit the voltage of the initialization power source Vint to the first node N1 when the scan signal is supplied to the (i−1)-th scan line Si−1. The initialization power source Vint may be set to a lower voltage than the data signal.

The fifth transistor T5 may be connected between the first power source ELVDD and the source electrode of the first transistor T1. A gate electrode of the fifth transistor T5 may be connected to the i-th emission control line Ei. The fifth transistor T5 may be turned off when the emission control signal is supplied to the i-th emission control line Ei, and may be turned on in the other cases.

The sixth transistor T6 may be connected between the drain electrode of the first transistor T1 and the anode electrode of the light emitting element OLED. A gate electrode of the sixth transistor T6 may be connected to the i-th emission control line Ei. The sixth transistor T6 may be turned off when the emission control signal is supplied to the i-th emission control line Ei, and may be turned on in the other cases.

The seventh transistor T7 may be connected between the initialization power source Vint and the anode electrode of the light emitting device OLED, for example, between the initialization power source Vint and a second node. A gate electrode of the seventh transistor T7 may be connected to an (i+1)-th scan line Si+1. The seventh transistor T7 may be turned on to transmit the voltage of the initialization power source Vint to the anode electrode of the light emitting element OLED when the scan signal is provided to the (i+1)-th scan line Si+1.

The storage capacitor Cst may be connected between the first power source ELVDD and the first node N1. The storage capacitor Cst may store a voltage corresponding to the data signal and a threshold voltage of the first transistor T1.

Figure 5:
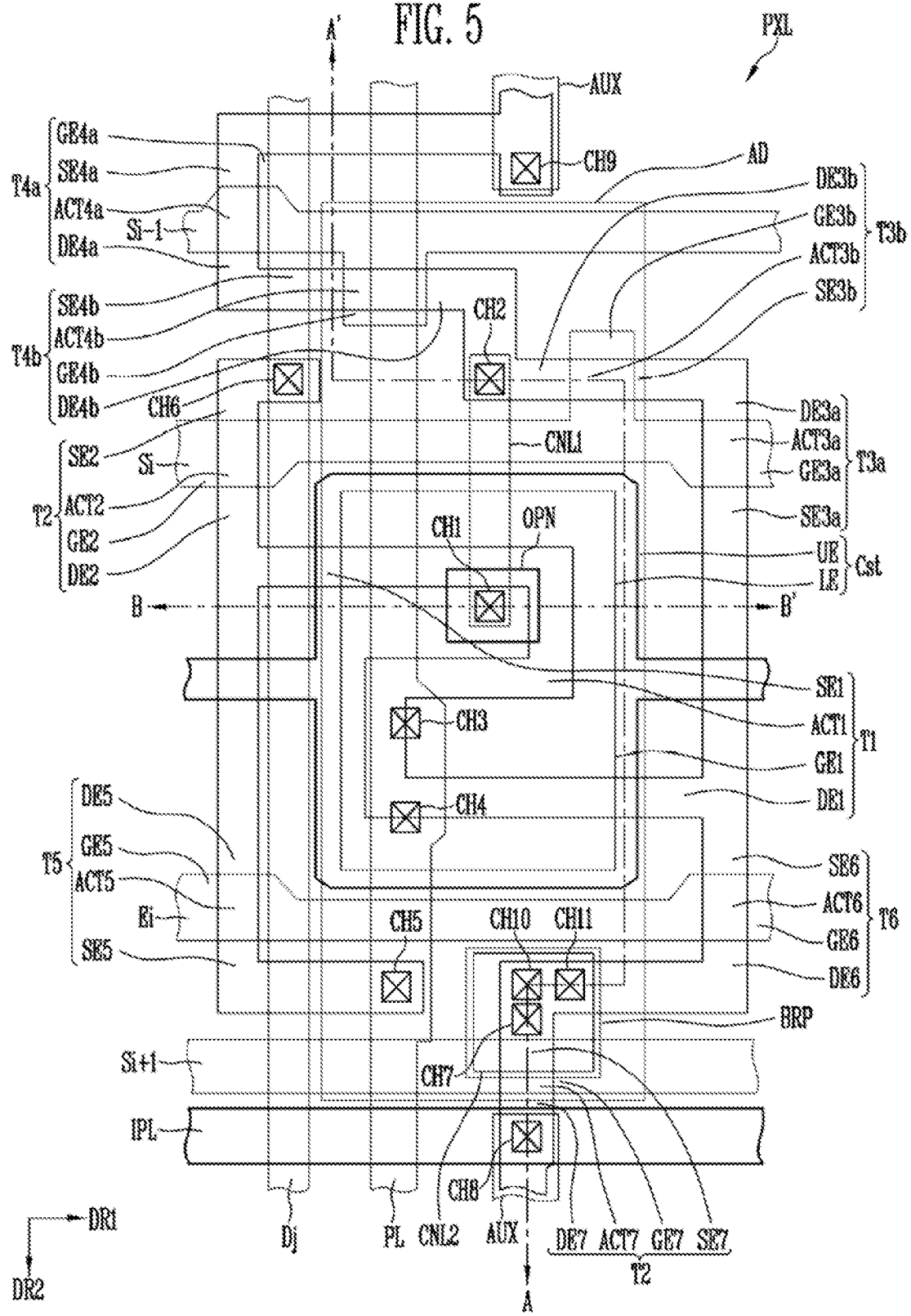
FIG. 5 is a plan view illustrating an example of the pixel of FIG. 4.
Figure 6:
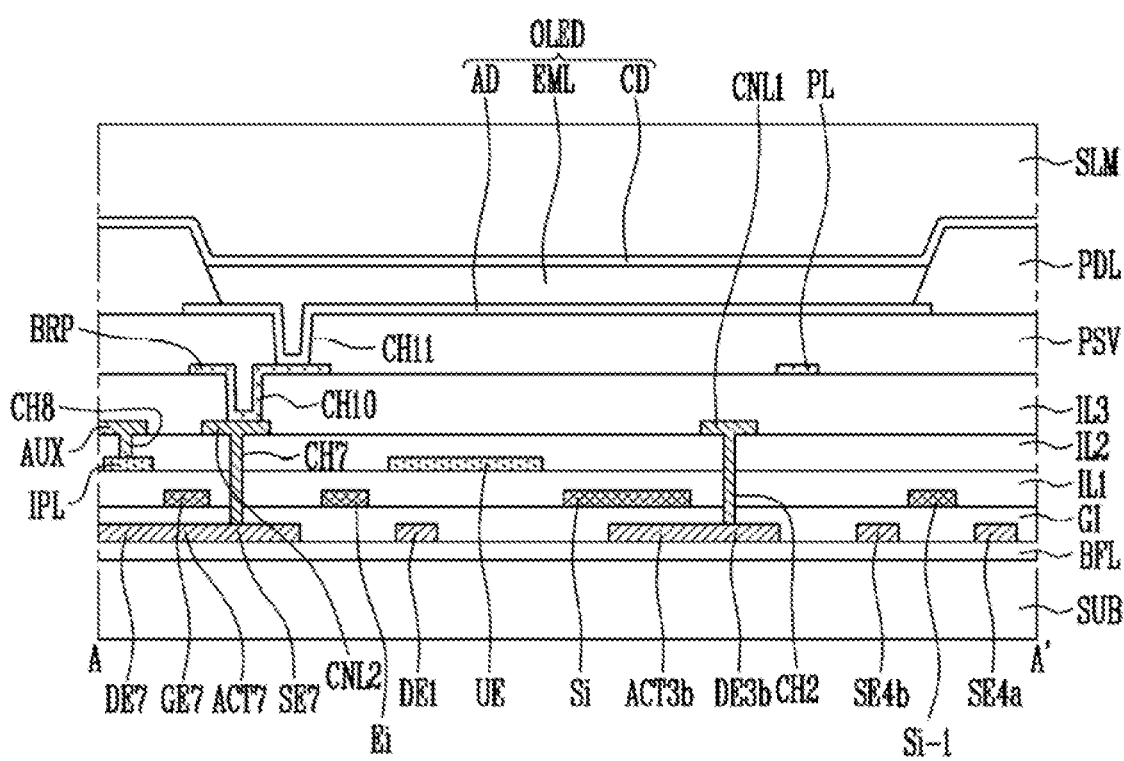
FIG. 6 is a cross-sectional view taken along section line A-A' of FIG. 5.
Figure 7:
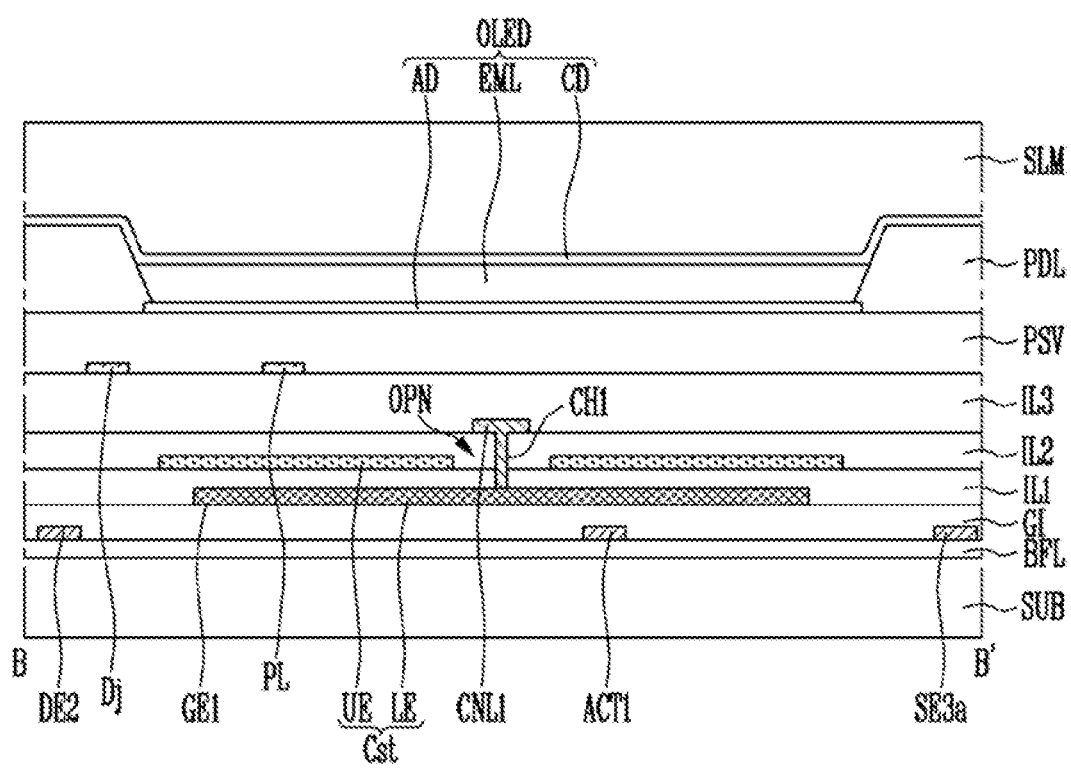
FIG. 7 is a cross-sectional view taken along section line B-B' of FIG. 5.

FIG. 5 is a plan view illustrating an example of the pixel of FIG. 4. FIG. 6 is a cross-sectional view taken along section line A-A' of FIG. 5. FIG. 7 is a cross-sectional view taken along section line B-B' of FIG. 5.

In FIGS. 5 to 7, three scan lines Si−1, Si, and Si+1, an emission control line E1, a power line PL, and a data line Dj are connected to a single pixel PXL arranged at an i-th row and a j-th column.

For convenience of explanation to FIGS. 5 to 7, a scan line of the (i−1)-th row is referred to as the (i−1)-th scan line Si−1, a scan line of the i-th row is referred to as the i-th scan line Si, a scan line of the (i+1)-th row is referred to as the (i+1)-th scan line Si+1, an emission control line of the i-th row is referred to as the emission control line Ei, a data line of the j-th column referred to as the data line Dj, and a power line of the j-th column is referred to as the power line PL.

Referring to FIGS. 4 to 7, the display device may include the substrate SUB, the wiring portion, and the pixel PXL.

The substrate SUB may include a transparent insulating material configured to transmit light. The substrate SUB may be a rigid substrate or a flexible substrate. The rigid substrate may include glass, quartz, glass-ceramic, and/or a crystalline glass. The flexible substrate may be a film substrate including a polymer organic material and/or a plastic. For example, the flexible substrate may be formed of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and/or cellulose acetate propionate (CAP). In addition, the flexible substrate may include fiberglass reinforced plastic (FRP).

The material applied to the substrate SUB may preferably have heat resistance sufficient to hold up to a high processing temperature in the manufacturing process of the display device. In some exemplary embodiments of the present disclosure, the substrate SUB may be entirely or at least partially flexible.

The wiring portion may provide a signal to the pixel PXL and may include the scan lines Si−1, Si, and Si+1, the data line Dj, the emission control line Ei, the power line PL, and an initialization power line IPL.

The scan lines Si−1, Si, and Si+1 may extend in the first direction DR1. The scan lines Si−1, Si, and Si+1 may be sequentially arranged along the second direction DR2 intersecting with the first direction DR1. Scan signals may be applied to the scan lines Si−1, Si, and Si+1. For example, an (i−1)-th scan signal may be applied to the (i−1)-th scan line Si−1, an i-th scan signal may be applied to the i-th scan line Si, and an (i+1)-th scan signal may be applied to the (i+1)-th scan line Si+1.

In some exemplary embodiments of the present disclosure, three scan lines Si−1, Si, and Si+1 are shown for applying the scan signal to the pixel PXL, but other numbers of scan lines may be used. For example, the scan signal may be applied to the pixel PXL through the two scan lines Si−1 and Si. In this example, the i-th scan line Si among the two scan lines Si−1 and Si may be branched into two lines, and the branched i-th scan lines Si may be connected to different transistors. For example, the i-th scan line Si may include an upper i-th scan line adjacent to the (i−1)-th scan line Si−1 and a lower i-th scan line farther from the (i−1)-th scan line Si−1 than the upper i-th scan line.

The emission control line Ei may extend in the first direction DR1 and be arranged between the i-th scan line Si and the (i+1)-th scan line Si+1. The emission control line Ei may be spaced apart from the (i+1)-th scan line Si+1 and the i-th scan line Si. The emission control signal may be applied to the emission control line Ei.

The data lines Dj may extend in the second direction DR2 and may be sequentially arranged along the first direction DR1. The data signal may be applied to the data line Dj.

The power supply line PL may extend along the second direction DR2. The power supply line PL may be spaced apart from the data line Dj. The first power source ELVDD may be applied to the power line PL.

The initialization power line IPL may extend along the first direction DR1. The initialization power line IPL may be disposed between the (i+1)-th scan line Si+1 and the (i−1)-th scan line Si−1 of the next row pixel. The initialization power source Vint may be applied to the initialization power line IPL.

The pixel PXL may include the first to seventh transistors T1 to T7, the storage capacitor Cst, and the light emitting element OLED.

The first transistor T1 may include a first gate electrode GE1, a first active pattern ACT1, a first source electrode SE1, a first drain electrode DE1, and a first connecting line CNL1.

The first gate electrode GE may be connected to a third drain electrode DE3 of the third transistor T3 and a fourth drain electrode DE4 of the fourth transistor T4. The first connecting line CNL1 may connect the first gate electrode GE1, the third drain electrode DE3, and the fourth drain electrode DE4. One end of the first connecting line CNL1 may be connected to the first gate electrode GE1 through a first contact hole CH1 and the other end of the first connecting line CNL1 may be connected to the third drain electrode DE3 and the fourth drain electrode DE4 through a second contact hole CH2.

In some exemplary embodiments of the present disclosure, each of the first active pattern ACT1, the first source electrode SE1, and the first drain electrode DE1 may be formed of a semiconductor layer in which either no impurity is doped or an impurity is doped. For example, the first source electrode SE1 and the first drain electrode DE1 may be formed of a semiconductor layer doped with the impurity, and the first active pattern ACT1 may include a semiconductor layer in which the impurity is not doped.

The first active pattern ACT1 may have a bar shape extending primarily in a predetermined direction and may be bent one or more times along an extended longitudinal direction. The first active pattern ACT1 may overlap the first gate electrode GE1 when viewed on a plan. A channel region of the first transistor T1 may be relatively long by forming of the first active pattern ACT1 to be long. Accordingly, a driving range of the gate voltage applied to the first transistor T1 may be widened. Therefore, the gray level of the light emitted from the organic light emitting element OLED may be finely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the i-th scan line Si. The second gate electrode GE2 may be a part of the i-th scan line Si or may protrude from the i-th scan line Si.

In some exemplary embodiments of the present disclosure, each of the second active pattern ACT2, the second source electrode SE2, and the second drain electrode DE2 may be formed of a semiconductor layer that has either been doped or has not been doped. For example, the second source electrode SE2 and the second drain electrode DE2 may be formed of a semiconductor layer doped with the impurity, and the second active pattern ACT2 may include a semiconductor layer in which the impurity is not doped.

The second active pattern ACT2 may correspond to a portion overlapping the second gate electrode GE2. The second source electrode SE2 may have one end connected to the second active pattern ACT2 and the other end connected to the data line Dj through a sixth contact hole CH6. The second drain electrode DE2 may have one end connected to the second active pattern ACT2 and the other end connected to the first source electrode SE1 of the first transistor T1 and the fifth drain electrode DE5 of the fifth transistor T5.

The third transistor T3 may have a double gate structure configured to prevent a leakage current. For example, the third transistor T3 may include a 3a-th transistor T3$a$ and a 3b-th transistor T3$b$. The 3a-th transistor T3$a$ may include a 3a-th gate electrode GE3$a$, a 3a-th active pattern ACT3$a$, a 3a-th source electrode SE3$a$, and a 3a-th drain electrode DE3$a$. The 3b-th transistor T3$b$ may include a 3b-th gate electrode GE3$b$, a 3b-th active pattern ACT3$b$, a 3b-th source electrode SE3$b$, and a 3b-th drain electrode DE3$b$. For convenience of explanation, the 3a-th gate electrode GE3$a$ and the 3b-th gate electrode GE3$b$ are referred to as the third gate electrode GE3, the 3a-th active pattern ACT3$a$ and the 3b-th active pattern ACT3$b$ are referred to as the third active pattern ACT3, the 3a-th source electrode SE3$a$ and the 3b-th source electrode SE3$b$ are referred to as the third source electrode SE3, and the 3a-th drain electrode DE3$a$ and the 3b-th drain electrode DE3$b$ are referred to as the third drain electrode DE3.

The third gate electrode GE3 may be connected to the i-th scan line Si. The third gate electrode GE3 may be a part of the i-th scan line Si or may protrude from the i-th scan line Si.

Each of the third active pattern ACT3, the third source electrode SE3, and the third drain electrode DE3 may be formed of a semiconductor layer that has either been doped or has not been doped. For example, the third source electrode SE3 and the third drain electrode DE3 may be formed of a semiconductor layer doped with the impurity, and the third active pattern ACT3 may include a semiconductor layer in which the impurity is not doped. The third active pattern ACT3 may correspond to a portion overlapping the third gate electrode GE3.

One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. The third drain electrode DE3 may be electrically connected to the first gate electrode GE1 of the first transistor T1 through the first connecting line CNL1, the second contact hole CH2, and the first contact hole CH1.

The fourth transistor T4 may have a double gate structure configured to prevent a leakage current. For example, the fourth transistor T4 may include a 4a-th transistor T4$a$ and a 4b-th transistor T4$b$. The 4a-th transistor T4$a$ may include a 4a-th gate electrode GE4$a$, a 4a-th active pattern ACT4$a$, a 4a-th source electrode SE4$a$, and a 4a-th drain electrode DE4$a$. The 4b-th transistor T4$b$ may include a 4b-th gate electrode GE4$b$, a 4b-th active pattern ACT4$b$, a 4b-th source electrode SE4$b$, and a 4b-th drain electrode DE4$b$. In some exemplary embodiments of the present disclosure, for convenience of explanation, the 4a-th gate electrode GE4$a$ and the 4b-th gate electrode GE4$b$ are referred to as the fourth gate electrode GE4, the 4a-th active pattern ACT4$a$ and the 4b-th active pattern ACT4$b$ are referred to as the fourth active pattern ACT4, the 4a-th source electrode SE4$a$ and the 4b-th source electrode SE4$b$ are referred to as the fourth source electrode SE4, and the 4a-th drain electrode DE4$a$ and the 4b-th drain electrode DE4$b$ are referred to as the fourth drain electrode DE4.

The fourth gate electrode GE4 may be connected to the (i−1)-th scan line Si−1. The fourth gate electrode GE4 may be a part of the (i−1)-th scan line Si−1 or may protrude from the (i−1)-th scan line Si−1.

Each of the fourth active pattern ACT4, the fourth source electrode SE4, and the fourth drain electrode DE4 may be formed of a semiconductor layer that has either been doped or has not been doped. For example, the fourth source electrode SE4 and the fourth drain electrode DE4 may be formed of a semiconductor layer doped with the impurity, and the fourth active pattern ACT4 may be formed of a semiconductor layer in which the impurity is not doped. The fourth active pattern ACT4 may correspond to a portion overlapping the fourth gate electrode GE4.

One end of the fourth source electrode SE4 may be connected to the fourth active pattern ACT4. The other end of the fourth source electrode SE4 may be connected to the initialization power line IPL of the pixel PXL of the (i−1)-th row and a seventh drain electrode DE7 of the seventh transistor T7 of the pixel PXL. An auxiliary connecting line AUX may be disposed between the fourth source electrode SE4 and the initialization power line IPL. One end of the auxiliary connecting line AUX may be connected to the fourth source electrode SE4 through a ninth contact hole CH9. The other end of the auxiliary connecting line AUX may be connected to the initialization power line of the pixel PXL of the (i−1)-th row through an eighth contact hole CH8 of the pixel PXL of the (i−1)-th row. One end of the fourth drain electrode DE4 may be connected to the fourth active pattern ACT4. The other end of the fourth drain electrode DE4 may be connected to the third drain electrode DE3 of the third transistor T3. The fourth drain electrode DE4 may also be connected to the first gate electrode GE1 of the first transistor T1 through the first connecting line CNL1, the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the emission control line Ei. The fifth gate electrode GE5 may be a part of the emission control line Ei or may protrude from the emission control line Ei. Each of the fifth active pattern ACT5, the fifth source electrode SE5, and the fifth drain electrode DE5 may be formed of a semiconductor layer that is either doped or undoped. For example, the fifth source electrode SE5 and the fifth drain electrode DE5 may be formed of a semiconductor layer in which the impurity is not doped. The fifth active pattern ACT5 may correspond to a portion overlapped with the fifth gate electrode GE5.

One end of the fifth source electrode SE5 may be connected to the fifth active pattern ACT5. The other end of the fifth source electrode SE5 may be connected to the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the emission control line Ei. The sixth gate electrode GE6 may be a part of the emission control line Ei or may protrude from the emission control line Ei. Each of the sixth active pattern ACT6, the sixth source electrode SE6, and the sixth drain electrode DE6 are formed of a semiconductor layer that is either doped or undoped. For example, the sixth source electrode SE6 and the sixth drain electrode DE6 may be formed of a semiconductor layer doped with the impurity, and the sixth active pattern ACT6 may be formed of a semiconductor layer in which the impurity is not doped. The sixth active pattern ACT6 may correspond to a portion overlapped with the sixth gate electrode GE6.

One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, a seventh source electrode SE7, and a seventh drain electrode DE7.

The seventh gate electrode GE7 may be connected to the (i+1)-th scan line Si+1. The seventh gate electrode GE7 may be a part of the (i+1)-th scan line Si+1 or may protrude from the (i+1)-th scan line Si+1. Each of the seventh active pattern ACT7, the seventh source electrode SE7, and the seventh drain electrode DE7 may be formed of a semiconductor layer that is either doped or undoped. For example, the seventh source electrode SE7 and the seventh drain electrode DE7 may be formed of the semiconductor layer doped with the impurity, and the seventh active pattern ACT7 may be formed of the semiconductor layer in which the impurity is not doped. The seventh active pattern ACT7 may correspond to a portion overlapping the seventh gate electrode GE7.

One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. The seventh drain electrode DE7 may be connected to the fourth source electrode SE4 of the fourth transistor T4 of the pixel PXL arranged in the (i+1)-th row. The seventh drain electrode DE7 may be connected to the fourth source electrode SE4 of the fourth transistor T4 of the pixel PXL arranged in the (i+1)-th row through the auxiliary connecting line AUX, the contact hole CH8, and the ninth contact hole CH9.

The storage capacitor Cst may include a lower electrode LE and an upper electrode UE. The lower electrode LE may be the first gate electrode GE1 of the first transistor T1.

The upper electrode UE may overlap the lower electrode LE and cover the lower electrode LE when viewed in a plan view. The capacitance of the storage capacitor Cst may be increased by enlarging the overlapping area of the upper electrode UE and the lower electrode LE. The upper electrode UE may extend in the first direction DR1. In some exemplary embodiments of the present disclosure, a voltage of the same level as that of the first power ELVDD may be applied to the upper electrode UE. The upper electrode UE may have an opening OPN in a region where the first contact hole CH1 to which the first gate electrode GE1 and the first connecting line CNL1 are connected is formed.

The organic light emitting element OLED may include a first electrode AD, a second electrode CD, and a light emitting layer EML disposed between the first electrode AD and the second electrode CD.

The first electrode AD may be disposed in a light emitting area corresponding to the pixel PXL. The first electrode AD may be connected to the seventh source electrode SE7 of the seventh transistor T7 and the sixth drain electrode DE6 of the sixth transistor T6 through a seventh contact hole CH7 and a tenth contact hole CH10. A second connecting line CNL2 and a bridge pattern BRP may be disposed between the seventh contact hole CH7 and the tenth contact hole CH10 so that the sixth drain electrode DE6 and the seventh source electrode SE7 may be connected to the first electrode AD.

Hereinafter, the structure of a display device according to an exemplary embodiment of the present disclosure will be described with reference to FIGS. 5 to 7.

A buffer layer BFL may be disposed on the substrate SUB. The buffer layer BFL may prevent impurities from diffusing into the first to seventh transistors T1 to T7. The buffer layer BFL may be a single layer, but may alternatively include two or more layers. When the buffer layer BFL includes multiple layers, each layer may be formed of the same material or different materials. The buffer layer BFL may be omitted depending on the material of the substrate SUB and/or the process conditions.

The active patterns ACT1 to ACT7 (hereinafter referred to as ACT) may be disposed on the buffer layer BFL. The active pattern ACT may include the first active pattern ACT1 to the seventh active pattern ACT7. The first active pattern ACT1 to the seventh active pattern ACT7 may be formed of a semiconductor material.

A gate insulating layer GI may be disposed on the buffer layer BFL and the active pattern ACT. The gate insulating layer GI may be an inorganic insulating layer containing an inorganic material. For example, the gate insulating layer GI may include silicon nitride, silicon oxide, and/or silicon oxynitride.

The (i−1)-th scan line Si−1, the i-th scan line Si−1, the (i+1)-th scan line Si+1, the emission control line Ei, and the first to seventh gate electrodes GE1 to GE7 may be disposed on the gate insulating layer GI. The first gate electrode GE1 may be the lower electrode LE of the storage capacitor Cst. The second gate electrode GE2 and the third gate electrode GE3 may be formed integrally with the i-th scan line Si. The fourth gate electrode GE4 may be formed integrally with the (i−1)-th scan line Si−1 and the seventh gate electrode GE7 may be formed integrally with the (i+1)-th scan line Si+1. The fifth gate electrode GE5 and the sixth gate electrode GE6 may be formed integrally with the emission control line Ei.

A first insulating layer IL1 may be disposed on the substrate SUB on which the scan lines Si−1, Si, and S+1 and the like are disposed.

The upper electrode UE of the storage capacitor Cst and the initialization power line IPL may be disposed on the first insulation layer IL1. The upper electrode UE may cover the lower electrode LE. The upper electrode UE may form the storage capacitor Cst together with the lower electrode with the first insulating layer IL1 interposed therebetween.

A second insulating layer IL2 may be disposed on the substrate SUB on which the upper electrode UE and the initialization power line IPL are disposed.

The first and second connecting lines CNL1 and CNL2 and the auxiliary connecting line AUX may be disposed on the second insulating layer IL2.

The first connecting line CNL1 may be connected to the first gate electrode GE1 through the first contact hole CH1 sequentially passing through the first and second insulating layers IL1 and IL2. The first connecting line CNL1 is electrically connected to the third drain electrode DE3 and the fourth drain electrode DE4 through the second contact hole CH2 CH7 sequentially passing through the gate insulation layer GI and the first and second insulating layers IL1 and IL2.

The second connecting line CNL2 is a medium connecting the sixth drain electrode DE6 and the first electrode AD between the sixth drain electrode DE6 and the first electrode AD. The second connecting line CNL2 may be electrically connected to the sixth drain electrode DE6 and the seventh source electrode SE7 through the seventh contact hole CH7 sequentially passing through the gate insulation layer GI and the first and second insulation layers IL1 and IL2.

The auxiliary connecting line AUX may be connected to the initialization power line IPL through the eighth contact hole CH8 passing through the second insulating layer IL2. The auxiliary connecting line AUX may be electrically connected to the fourth source electrode SE4 and the seventh drain electrode of the pixel in the (i−1)-th row through the ninth contact hole CH9 passing through the gate insulating layer GI and the first and second insulating layers IL1 and IL2.

In some exemplary embodiments of the present disclosure, as shown in the figure, the first and second connecting lines CNL1 and CNL2 may be disposed on the second insulating layer IL2. However, the arrangement of the first and second connecting lines is not limited thereto. For example, the first and second connecting lines CNL1 and CNL2 may be disposed on the third insulating layer IL3 to be described below.

A third insulating layer IL3 may be disposed on the first and second connecting lines CNL1 and CNL2 and the auxiliary connecting lines AUX. The third insulating layer IL3 may be an inorganic insulating layer containing an inorganic material or an organic insulating layer containing an organic material. In some exemplary embodiments of the present disclosure, the third insulating layer IL3 may be an organic insulating layer. The third insulating layer IL3 may be a single layer as shown in the figure, but other arrangements may be used. For example, the third insulating layer IL3 may be formed of multiple layers. When the third insulating layer IL3 is formed of multiple layers, the third insulating layer IL3 may have a structure in which plurality of inorganic insulating layers and a plurality of organic insulating layers are alternately stacked. For example, the third insulating layer IL3 may have a structure in which a first organic insulating layer, an inorganic insulating layer, and a second organic insulating layer are sequentially stacked.

The bridge pattern BRP, the data line Dj, and the power line PL may each be disposed on the third insulating layer IL3.

The bridge pattern BRP may be connected to the second connecting line CNL2 through the tenth contact hole CH10 passing through the third insulation layer IL3.

The data line Dj may be electrically connected to the second source electrode SE2 through the sixth contact hole CH6 penetrating the gate insulating layer GI and the first to third insulating layers IL1 to IL3. As illustrated in the figure, the data line Dj may be disposed on the third insulating layer IL3, but other arrangements may be used. For example, the data line Dj may be disposed on the second insulating layer IL2 and on the same layer as the first and second connecting lines CNL1 and CNL2.

The power line PL may be connected to the upper electrode UE through the third and fourth contact holes CH3 and CH4 passing through the second and third insulating layers IL2 and IL3. The power line PL may be electrically connected to the fifth source electrode SE5 through the fifth contact hole CH5 passing through the gate insulating layer GI and the first through third insulating layers IL1 through IL3. As illustrated in FIG. 6, the power supply line PL may be disposed on the third insulating layer IL3, but other arrangements may be used. For example, the power line PL may be disposed on the second insulating layer IL2 and on the same layer as the first and second connecting lines CNL1 and CNL2.

The first electrode AD may be disposed on the bridge pattern BRP. The first electrode AD may be connected to the bridge pattern BRP through an eleventh contact hole CH11 passing through a passivation layer PSV. Since the bridge pattern BRP is connected to the second connecting line CNL2 through the tenth contact hole CH10, the first electrode AD may be finally connected to the sixth drain electrode DE6 and the seventh source electrode SE7 through the bridge pattern BRP and the second capacitor CNL2.

A pixel defining layer PDL may be disposed on the substrate SUB on which the first electrode AD is formed to define a light emitting area corresponding to each pixel PXL. The pixel defining layer PDL may expose the upper surface of the first electrode AD and protrude from the substrate SUB along the periphery of the pixel PXL.

The light emitting layer EML may be disposed on the exposed upper surface of the first electrode AD. The second electrode CD may be disposed on the light emitting layer EML.

The pixel defining layer PDL may include an organic insulating material. For example, the pixel defining layer PDL may be formed of polystyrene, polymethylmethacrylate (PMMA), polyacrylonitrile (PAN), polyimide (PA), polyimide, polyarylether, heterocyclic polymer, parylene, epoxy, benzocyclobutene (BCB), siloxane based resin, and/or silane based resin, and the like.

The light emitting layer EML may be disposed on the exposed surface of the first electrode AD. The light emitting layer EML may have a multilayer thin film structure including at least a light generation layer. For example, the light emitting layer EML may include a hole injection layer for injecting holes, a hole transport layer for increasing opportunities for recombination of holes and electrons, the light generation layer for emitting light by recombination of the injected electrons and holes, a hole blocking layer for suppressing the movement of holes not coupled in the light generating layer, an electron transport layer for smoothly transporting electrons to the light-generating layer, and an electron injection layer for injecting electrons.

The color of light generated in the light generation layer may be one of red, green, blue, and white, but other colors may be so generated. For example, the color of light generated in the light generation layer of the light emitting layer EML may be one of magenta, cyan, and yellow.

The hole injecting layer, the hole transporting layer, the hole blocking layer, the electron transporting layer, and the electron injecting layer may be common layers connected to each other in adjacent light emitting areas.

A thin film encapsulation TFE covering the second electrode CD may be disposed on the second electrode CD.

The thin film encapsulation TFE may consist of a single layer, but may alternatively include multiple layers. The thin film encapsulation TFE may include a plurality of insulating layers covering the light emitting element OLED. For example, the thin film encapsulation TFE may include a plurality of inorganic layers and a plurality of organic layers. For example, the thin film encapsulation TFE may have a structure in which the inorganic layer and the organic layer are alternately stacked. In some exemplary embodiments of the present disclosure, the thin film encapsulation TFE may be an encapsulating substrate disposed on the light emitting element OLED and bonded to the substrate SUB through a sealant.

The display device may further include a touch sensor disposed on the thin film encapsulation TFE. The touch sensor may be disposed on a surface of the substrate SUB in a direction in which an image is emitted to receive a user's touch input. A touch event input to the display device may be recognized through the user's hand or another input means.

The touch sensor may be driven by a mutual capacitance method. The mutual capacitance method senses a change in capacitance due to an interaction between two touch sensing electrodes. In addition, the touch sensor may be driven by a self-capacitance method. The self-capacitance method uses touch sensing electrodes arranged in a matrix form and sensing lines connected to each of the touch sensing electrodes to sense a change of the capacitance of the sensing electrode in the touched region.

The touch sensor may include the touch sensing electrode, the sensing line connected to the touch sensing electrode, and a pad portion connected to an end of the sensing line.

A window for protecting the exposed surface of the touch sensor may be disposed on the touch sensor. The window transmits an image from the substrate SUB and protects the display device from external impact. Thus, it is possible to prevent the display device from being broken or malfunctioning due to an external impact.

Figure 8:
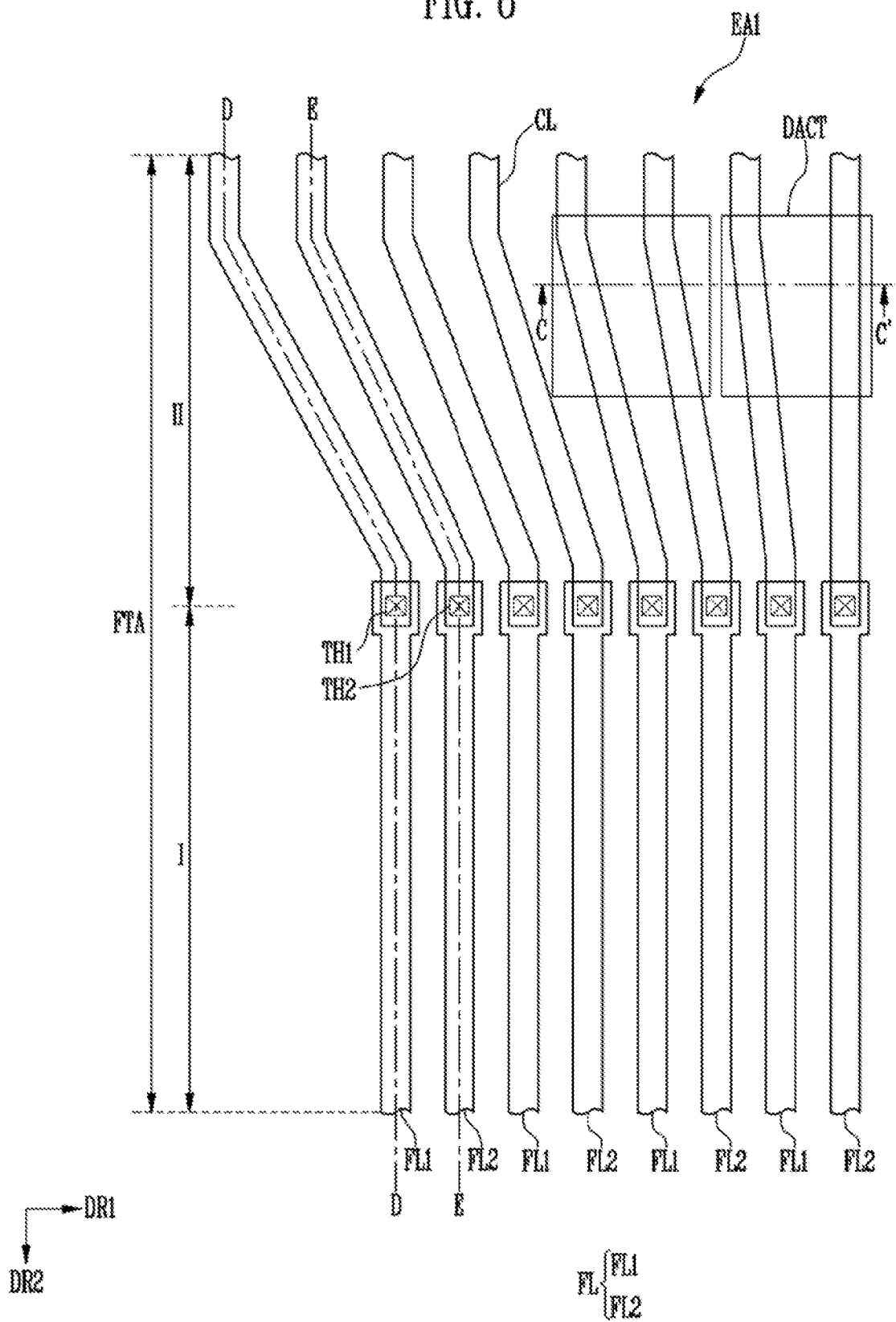
FIG. 8 is an enlarged view illustrating an example of an area EA1 of FIG. 1.
Figure 9:
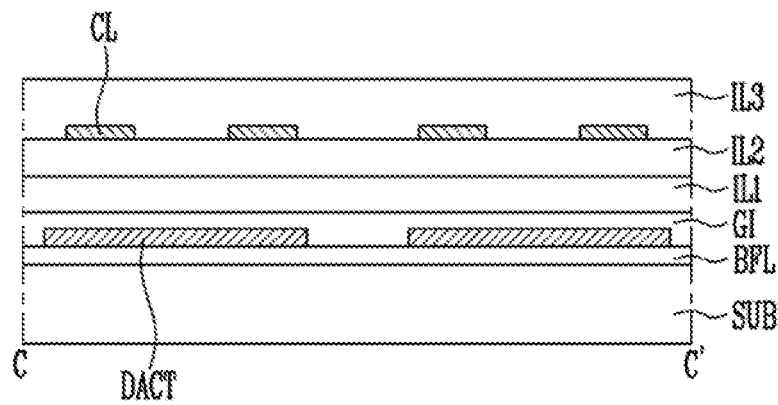
FIG. 9 is a cross-sectional view taken along section line C-C' of FIG. 8.
Figure 10:
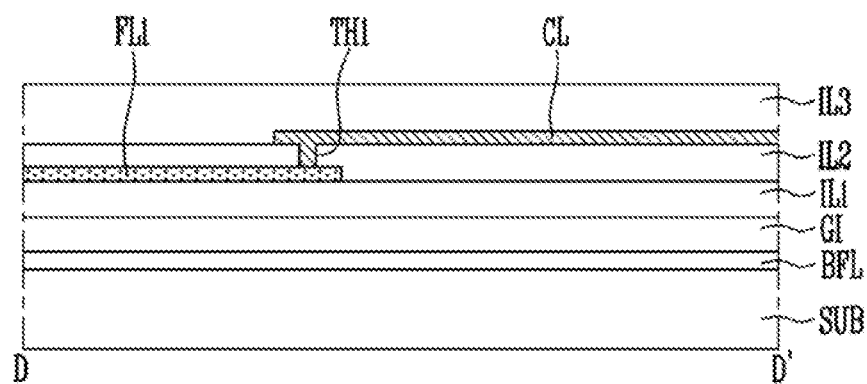
FIG. 10 is a cross-sectional view taken along section line D-D' of FIG. 8.
Figure 11:
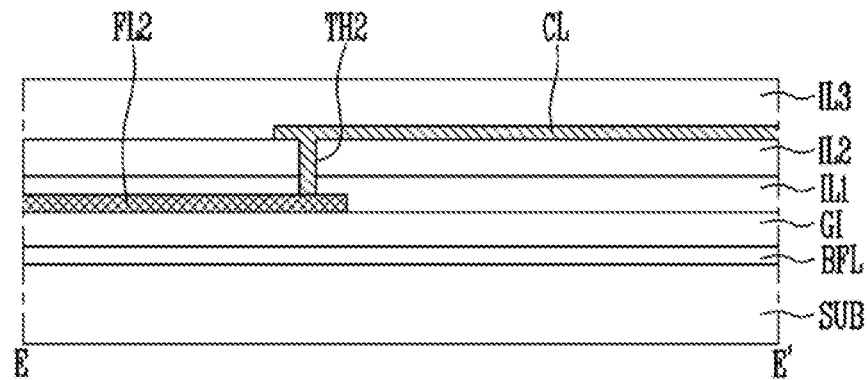
FIG. 11 is a cross-sectional view taken along section line E-E' of FIG. 8.

FIG. 8 is an enlarged view illustrating an example of an area EA1 of FIG. 1. FIG. 9 is a cross-sectional view taken along section line C-C' of FIG. 8. FIG. 10 is a cross-sectional view taken along section line D-D' of FIG. 8. FIG. 11 is a cross-sectional view taken along section line E-E' of FIG. 8.

FIGS. 8 to 11 show the connection relationship between the lines in the fan-out area of the substrate. For convenience of explanation, a connecting line connected to the data line of the display area and a fan-out line connecting the connecting line and a driver are illustrated.

Referring to FIGS. 1 to 11, the substrate SUB may include the display area DA and the non-display area NDA.

The plurality of pixels PXL may be disposed in the display area DA.

Each of the pixels PXL may include the first to seventh transistors T1 to T7 and the light emitting element OLED connected to the first to seventh transistors T1 to T7 to emit light.

The pixels PXL may be arranged in a matrix form. For example, the pixels may constitute a plurality of pixel rows and a plurality of pixel columns in the display area DA. The pixel row may include the plurality of pixels PXL arranged in the first direction DR1 and may extend in the first direction DR1. The pixel columns may include the plurality of pixels PXL arranged in the second direction DR2 and may extend in the second direction DR2. The pixel columns may be arranged in the first direction DR1.

In some exemplary embodiments of the present disclosure, the pixels PXL may include the first pixels G for displaying green, the second pixels R for displaying red, and the third B pixels for displaying blue.

The first pixels G may be arranged in the second direction DR2 to form a first pixel column. The second pixels R and the third pixels B may be alternately arranged in the second direction DR2 to form a second pixel column. The first pixel column and the second pixel column may be provided in plurality and alternately arranged along the first direction DR1. Each pixel column may be connected to the data line DL.

The first transistor T1 may include the first active pattern ACT1, the first gate electrode GE1, the first source electrode SE1, and the first drain electrode DE1. The second transistor T2 may include the second active pattern ACT2, the second gate electrode GE2, the second source electrode SE2, and the second drain electrode DE2. The third transistor T3 may include the third active pattern ACT3, the third gate electrode GE3, the third source electrode SE3, and the third drain electrode DE3. The fourth transistor T4 may include the fourth active pattern ACT4, the fourth gate electrode GE4, the fourth source electrode SE4, and the fourth drain electrode DE4. The fifth transistor T5 may include the fifth active pattern ACT5, the fifth gate electrode GE5, the fifth source electrode SE5, and the fifth drain electrode DE5. The sixth transistor T6 may include the sixth active pattern ACT6, the sixth gate electrode GE6, the sixth source electrode SE6, and the sixth drain electrode DE6. The seventh transistor T7 may include the seventh active pattern ACT7, the seventh gate electrode GE7, the seventh source electrode SE7, and the seventh drain electrode DE7.

The non-display area NDA may include the wiring portion LP configured for applying a signal from the data driver DDV to the pixels PXL. The wiring portion LP may be disposed in the fan-out area FTA of the non-display area NDA. The wiring portion LP may include a plurality of connecting lines CL and a plurality of fan-out lines FL.

In some exemplary embodiments of the present disclosure, the fan-out area FTA may include a first area I in which the fan-out lines FL are arranged and a second area II which the connecting lines CL are arranged. The first area I may be an area adjacent to the data driver DDV in the fan-out region FTA and the second region II may be an area farther from the data driver DDV in the fan-out region FTA than the first area I.

Each connecting line CL may be a medium for electrically connecting one data line DL disposed in the display area DA and a corresponding fan-out line FL. For example, one end of each connecting line CL may be connected to corresponding one data line DL, and the other end of each connecting line CL may be connected to corresponding one fan-out line FL. The one end of each connecting line CL may be electrically connected to the corresponding data line DL through a separate contact electrode, but other arrangements may be used. For example, the one end of each connecting line CL may be integrally formed with the corresponding data line DL and may be directly electrically connected to the corresponding data line DL.

In the second area II of the fan-out region FTA, the connecting lines CL may extend in the second direction DR2. The connecting lines CL may extend approximately in the second direction DR2 and a space between adjacent connection lines CL may become narrower in the second direction DR2.

Each of the fan-out lines FL may be electrically connected to the corresponding one connection line CL and the data driver DDV. For example, one end of each fan-out line FL may be connected to the corresponding connecting line CL, and the other end of each fan-out line FL may be connected to the data driver DDV. The data signal from the data driver DDV may be finally supplied to the corresponding one data line DL of the display area DA through each of the fan-out lines FL and the connecting line CL.

In some exemplary embodiments of the present disclosure, the fan-out lines FL may include a first fan-out line FL1 and a second fan-out line FL2. The first and second fan-out lines FL1 and FL2 may be disposed on different layers. For example, the first fan-out line FL1 may be disposed on a first insulating layer IL1 on the substrate SUB, and the second fan-out line FL2 may be disposed under the first insulation layer IL1. The first fan-out line FL1 and the second fan-out line FL2 may be alternately arranged when viewed on a plan view.

The first fan-out line FL1 may be connected to the data line DL in the first pixel column. The second fan-out line FL2 may be connected to the data line DL in the second pixel column.

The wiring portion LP of the non-display area NDA and the pixels PXL of the display area DA may be formed by a mask process using a photoresist pattern.

The signal lines connected to the first to seventh transistors T1 to T7 and the first to seventh transistors T1 to T7 arranged in each pixel PXL in the display area DA may be formed by the mask process using the photoresist pattern. The signal lines may include the scan lines (See Si−1, Si, and Si+1 in FIG. 5), the emission control line (See Ei in FIG. 5), the data line DL, and the power line (See PL in FIG. 5), and the like.

In the non-display area NDA, the wiring portion LP disposed in the fan-out area FTA may be formed by the mask process using the photoresist pattern.

As described above, in the display area DA in which an image is displayed, the number of structures formed using the photoresist pattern may be more than that in the non-display area NDA. A density of the photoresist pattern may vary depending on the area of the substrate SUB. For example, the photoresist patterns used in the mask process may be arranged in the display area DA to a greater extent than in the non-display area NDA.

In the non-display area NDA where the photoresist pattern is arranged at a low density, the amount of photoresist dissolved in the developing process may be larger than in the display area DA in which the photoresist pattern is arranged at high density. Therefore, a developer applied on the non-display area NDA may have a lowered concentration and a concentration difference of the developer between the non-display area NDA and the display area DA may occur. When such a concentration difference occurs, the high concentration developer may move toward the low concentration developer by the diffusion principle. Thus, the photoresist pattern of the non-display area NDA is over developed (e.g. developed in excess of the proper amount) and the thickness of the display device becomes ununiform. This non-uniformity of thickness may cause defects such as short circuits in the wiring portion LP of the non-display area NDA.

In some exemplary embodiments of the present disclosure, a dummy pattern may be disposed in the non-display area NDA to compensate for the density difference of the photoresist pattern between the display area DA and the non-display area NDA. Thus, the density of the photoresist pattern may be uniform in the display area DA and the non-display area NDA.

In some exemplary embodiments of the present disclosure, the dummy pattern may be a dummy active pattern DACT.

The dummy active pattern DACT may be disposed in the second area II of the fan-out area FTA. The dummy active pattern DACT may be floated. A shape of the dummy active pattern DACT may be a rectangular shape as shown in FIG. 8, but the dummy active pattern DACT may have various other shapes. For example, the dummy active pattern DACT may be shaped as a polygon, a circle, a semicircle, a half ellipse, etc.

In a plan view, the dummy active pattern DACT may overlap the plurality of connecting lines CL. The dummy active pattern DACT is shown to overlap with a part of the plurality of connecting lines CL, but other arrangements may be used. In some exemplary embodiments of the present disclosure, the dummy active pattern DACT may be disposed in the second area II so as to overlap with each of the plurality of connecting lines CL. The dummy active pattern DACT may be partially or completely connected to the connecting lines CL within a range that uniformizes the density of the photoresist pattern for the display area DA and the non-display area NDA.

The dummy active pattern DACT may be disposed on the buffer layer BFL on the substrate SUB. The buffer layer BFL may be a buffer layer (See BFL in FIG. 6) provided in the display area DA.

The dummy active pattern DACT may be a semiconductor pattern including polysilicon, amorphous silicon, oxide semiconductor, or the like. In some exemplary embodiments of the present disclosure, the dummy active pattern DACT may include the same material as the first to seventh active patterns ACT1 to ACT7 and may be disposed on the same layer as the first to seventh active patterns ACT1 to ACT7.

The gate insulating layer GI may be disposed on the dummy active pattern DACT. The gate insulating layer GI may be an inorganic insulating layer containing an inorganic material. The inorganic insulating layer may include silicon nitride, silicon oxide, silicon oxynitride, or the like.

The second fan-out line FL2 may be disposed on the gate insulating layer GI. In some exemplary embodiments of the present disclosure, the second fan-out line FL2 may include the same material as the scan lines Si−1, Si, and Si+1, the emission control line Ei in each pixel PXL, and may be disposed on the same layer as the scan lines Si−1, Si, Si+1, the emission control line Ei. The second fan-out line FL2 may be disposed on the same layer as the first to seventh gate electrodes GE1 to GE7.

The first insulating layer IL1 may be disposed on the second fan-out line FL2. The first insulating layer IL1 may include the same material as the gate insulating layer GI, but other materials may be used.

The first fan-out line FL1 may be disposed on the first insulation layer IL1. In some exemplary embodiments of the present disclosure, the first fan-out line FL1 may include the same material as the upper electrode UE of the storage capacitor Cst disposed in each pixel. PXL and be disposed on the same layer as the upper electrode UE. Also, the first fan-out line FL1 may include the same material as the initialization power line IPL disposed in each pixel PXL and may be disposed on the same layer as the initialization power line IPL.

The second insulating layer IL2 may be disposed on the first fan-out line FL1. The second insulating layer IL2 may include the same material as the first insulating layer IL1 and the gate insulating layer GI, but other materials may be used.

The connecting line CL may be disposed on the second insulation layer IL2. In some exemplary embodiments of the present disclosure, the connecting line CL may include the same material as the first and second connecting lines CNL1 and CNL2 disposed in each pixel PXL and may be disposed on the same layer as the first and second connecting lines CNL1 and CNL2.

In some exemplary embodiments of the present disclosure, as illustrated in FIG. 10, the first fan out line FL1 may be connected to a corresponding connecting line CL through a first through hole TH1 passing through the second insulating layer IL2. Therefore, the data signal applied from the data driver DDV to the first fan-out line FL1 may be transmitted to the connecting line CL electrically connected to the first fan-out line FL1. As a result, the data signal transferred to the connecting CL may be finally applied to the data line DL corresponding to the connecting line CL.

As illustrated in FIG. 11, the second fan-out line FL2 may be electrically connected to the corresponding connecting line CL through a second through hole TH2 sequentially passing through the first and second insulating layers IL1 and IL2. Accordingly, the data signal applied from the data driver DDV to the second fan-out line FL2 may be transmitted to the connecting line CL electrically connected to the second fan-out line FL2. As a result, the data signal transferred to the connecting line CL may be finally applied to the data line DL corresponding to the connecting line CL.

The third insulating layer IL3 may be disposed on the connecting line CL. The third insulating layer IL3 may be disposed in the display area DA.

In some exemplary embodiments of the present disclosure, the dummy active pattern DACT may be formed by the same process as the first to seventh active patterns ACT1 to ACT7 found in each pixel PXL. For example, the dummy active pattern DACT may be added to the fan-out area FTA by the mask process using the photoresist pattern in the same manner as the first to seventh active patterns ACT1 to ACT7.

Since a separate photoresist pattern is added to the non-display area NDA to form the dummy active pattern DACT in the fan-out area FTA, the density of the photoresist pattern in the non-display area NDA may be increased. Thus, the density of the photoresist pattern in the non-display area NDA may be made similar to the density of the photoresist pattern in the display area DA. The dummy active pattern DACT may be formed in various shapes within a range where the density of the photoresist pattern in the non-display area NDA may be increased by widening the overlapping area with the connecting lines CL.

As described above, the display device, according to exemplary embodiments of the present disclosure, may include the dummy active pattern DACT in the non-display area NDA, it is therefore possible to prevent defects that occur due to the difference in density between the display area DA and the non-display area NDA. As a result, the reliability of the display device may be increased.

Figure 12:
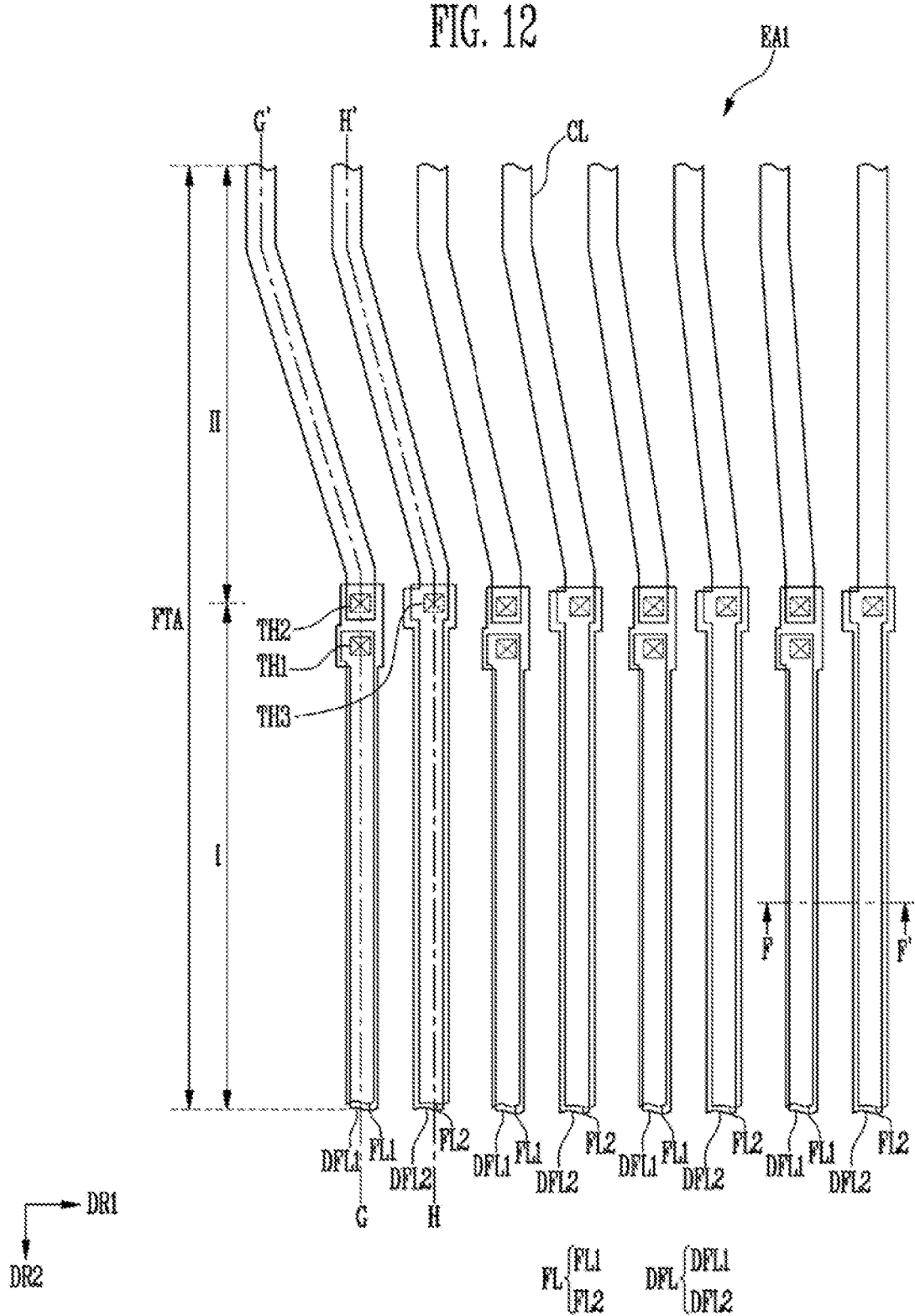
FIG. 12 is a plan view illustrating an example of a fan-out area corresponding to an area EA1 of FIG. 1.
Figure 13:
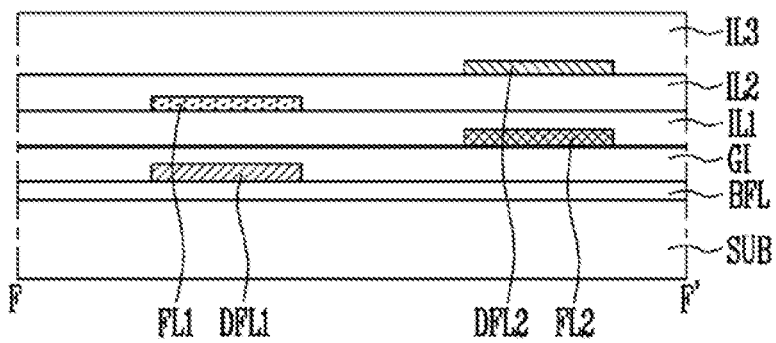
FIG. 13 is a cross-sectional view taken along section line F-F' of FIG. 12.
Figure 14:
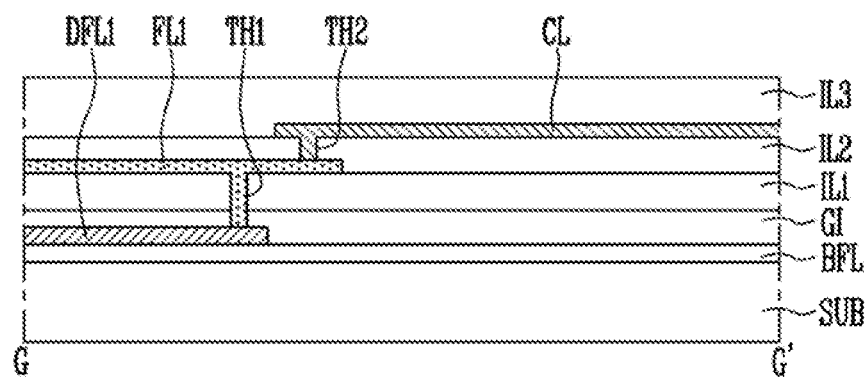
FIG. 14 is a cross-sectional view taken along section line G-G' of FIG. 12.
Figure 15:
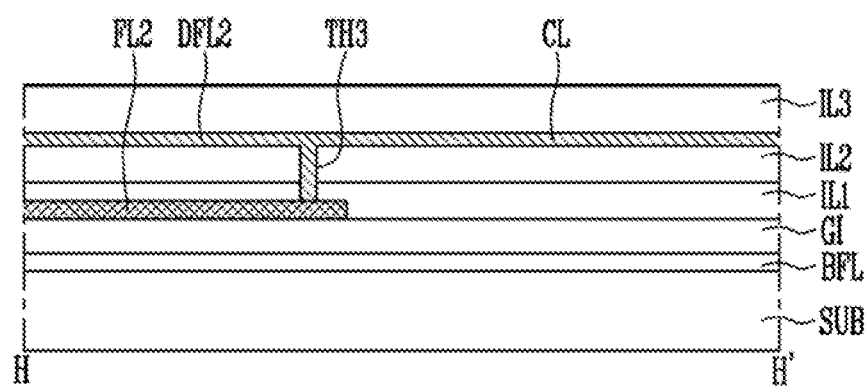
FIG. 15 is a cross-sectional view taken along section line H-H' of FIG. 12.

FIG. 12 is a plan view illustrating an example of a fan-out area corresponding to an area EA1 of FIG. 1. FIG. 13 is a cross-sectional view taken along section line F-F' of FIG. 12. FIG. 14 is a cross-sectional view taken along section line G-G' of FIG. 12. FIG. 15 is a cross-sectional view taken along section line H-H' of FIG. 12. The same reference numerals may refer to the same or like elements as those described above with respect to FIGS. 1 to 11, and it may be assumed that any omitted details may be at least similar to those described above with respect to corresponding elements.

FIGS. 12 to 15 show the connection relationship between the lines in the fan-out area of the substrate. For convenience of explanation, a connecting line connected to the data line of the display area and a fan-out line connecting the connecting line and a driver are illustrated.

Referring to FIGS. 1 to 7, and 12 to 15, the substrate SUB may include the display area DA and the non-display area NDA.

The plurality of pixels PXL may be disposed in the display area DA. Each pixel PXL may include the first to seventh transistors T1 to T7, the light emitting element OLED connected to the first to seventh transistors T1 to T7 for emitting light, and signal lines for transmitting signals to the first to seventh transistors T1 to T7. The signal lines may include the scan lines (See Si−1, Si, Si+1 in FIG. 5), the emission control line (See Ei in FIG. 5), the data line DL, and the power line (See PL in FIG. 5), and the like.

The non-display area NDA may include the fan-out area FTA in which the plurality of connecting lines CL and the plurality of fan-out lines FL are arranged. In some exemplary embodiments of the present disclosure, the fan-out area FTA may include a second area II in which the connecting lines CL are arranged and a first area I in which the fan-out lines FL are arranged.

Each of the connecting lines CL may be a medium for electrically connecting one data line DL disposed in the display area DA and a corresponding fan-out line FL. The connecting lines CL may extend in the second direction DR2 in the second area II and the space between the adjacent connecting lines CL may become narrower in the second direction DR2.

Each of the fan-out lines FL may be a medium for electrically connecting the corresponding connecting line CL and the data driver DDV. For example, one end of each fan-out line FL may be connected to the corresponding connecting line CL, and the other end of each fan-out line FL may be connected to the data driver DDV. Therefore, the data signal from the data driver DDV may be finally provided to the corresponding one data line DL through the fan-out line FL and the corresponding connecting line CL.

In some exemplary embodiments of the present disclosure, the fan-out lines FL may include the first fan-out line FL1 and the second fan-out line FL2. The first and second fan-out lines FL1 and FL2 may be disposed on different layers. For example, the first fan-out line FL1 may be disposed on the first insulating layer IL1 that is on the substrate SUB, and the second fan-out line FL2 may be disposed under the first insulation layer IL1. The first fan-out line FL1 and the second fan-out line FL2 may be alternately arranged when viewed on a plan view.

The first fan-out line FL1 may be connected to the data line DL in a first pixel column in which first pixels G emitting green color light among the pixels PXL are arranged in the second direction DR2. The second fan-out line FL2 may be connected to a data line DL in a second pixel column. The second pixel column may have a column having the second pixels R arranged in the second direction DR2 and a column having third pixels B arranged in the second direction DR2. The column having second pixels R and the column having third pixels B may be alternately arranged in the first direction DR1.

The fan-out area FTA may further include a dummy pattern overlapping with the fan-out line FL to make the density of the photoresist pattern of the non-display area NDA similar to the density of the photoresist pattern of the display area DA.

In some exemplary embodiments of the present disclosure, the dummy pattern may be a dummy line DFL including a first dummy line DFL1 and a second dummy line DFL2. In some exemplary embodiments of the present disclosure, the first dummy line DFL1 and the second dummy line DFL2 may be disposed in different layers.

The first dummy line DFL1 may be disposed in the first area I of the fan-out area FTA and may extend along the second direction DR2. The first dummy line DFL1 may overlap the first fan-out line FL1 when viewed in a plan view. The first dummy line DFL1 may be partially overlapped with the first fan-out line FL1, but other arrangements may be used. For example, the first dummy line DFL1 may completely overlap the first fan-out line FL1.

In some exemplary embodiments of the present disclosure, the first dummy line DFL1 and the first fan-out line FL1 may be disposed on different layers. The first dummy line DFL1 and the first fan-out line FL1 may be overlapped with each other with the first insulating layer IL1 and the gate insulating layer GI that is under the first insulating layer IL1 interposed therebetween. The first dummy line DFL1 may be disposed under the first fan-out line FL1.

The second dummy line DFL2 may be disposed in the first area I of the fan-out area FTA and extend in the second direction DR2. The second dummy line DFL2 may overlap the second fan-out line FL2 when viewed in a plan view. The second dummy line DFL2 may be partially overlapped with the second fan-out line FL2, but other arrangements may be used. For example, the second dummy line DFL2 may be completely overlapped with the second fan out line FL2.

In some exemplary embodiments of the present disclosure, the second dummy line DFL2 and the second fan-out line FL2 may be disposed on different layers. The second dummy line DFL2 and the second fan-out FL2 may be overlapped with each other with the first insulating layer IL1 and the second insulating layer IL2 on the first insulating layer IL1 interposed therebetween. The second dummy line DFL2 may be disposed on the second fan-out line FL2. The second dummy line DFL2 may be designed to have a width larger than the width of the second fan-out line FL2 along the first direction DR1 to completely cover the second fan-out line FL2, but other arrangements may be used. For example, the second dummy lime DFL2 may be designed to have the same width as the second fan-out line FL2.

Hereinafter, the first and second dummy lines DFL1 and DFL2, the first and second fan-out lines FL1 and FL2, and the connecting line CL will be described according to stacking order referring to FIGS. 13 to 15.

First, the buffer layer an may be disposed on the substrate SUB.

The first dummy line DFL1 may be disposed on the buffer layer BFL. The first dummy line DFL1 may be a semiconductor pattern including polysilicon, amorphous silicon, oxide semiconductor, or the like. In some exemplary embodiments of the present disclosure, the first dummy line DFL1 may be formed of the same material as the first to seventh active patterns ACT1 to ACT7 included in the first to seventh transistors T1 to T7, respectively, and may be disposed on the same layer as the first to seventh active patterns ACT1 to ACT7.

The gate insulating layer GI may be disposed on the first dummy line DFL1.

The second fan-out line FL2 may be disposed on the gate insulating layer GI. In some exemplary embodiments of the present disclosure, the second fan-out line FL2 may include the same material as the scan lines Si−1, Si, and Si+1, the emission control line Ei disposed in each pixel PXL, and may be disposed on the same layer as the scan lines Si−1, Si, and Si+1, the emission control line Ei. The second fan-out line FL2 may be disposed in the same layer as the first to seventh gate electrodes GE1 to GE7 included in the first to seventh transistors T1 to T7.

The first insulating layer IL1 may be disposed on the second fan-out line FL2. The first insulating layer IL1 may include the same material as the gate insulating layer GI, but other materials may be used.

The first fan-out line FL1 may be disposed on the first insulation layer IL1. In some exemplary embodiments of the present disclosure, the first fan-out line FL1 may include the same material as the upper electrode UE of the storage capacitor Cst that is in each pixel PXL and be disposed on the same layer as the upper electrode UE. Also, the first fan-out line FL1 may include the same material as the initialization power line IPL disposed in each pixel PXL and may be disposed on the same layer as the initialization power line IPL.

In some exemplary embodiments of the present disclosure, the first fan-out line FL1 may be electrically connected to the first dummy line DFL1 through the first through hole TH1 sequentially passing through the first insulating layer IL1 and the gate insulating layer GI. For example, the first fan-out line FL1 and the first dummy line DFL1 may be electrically connected. Therefore, the data signal applied from the data driver DDV to the first fan-out line FL1 may be transferred to the first dummy line DFL1 through the first through hole TH1. As a result, the same signal may be applied to the first dummy line DFL1 and the first fan-out line FL1.

The second insulating layer IL2 may be disposed on the first fan-out line FL1.

The connecting line CL and the second dummy line DFL2 may be disposed on the second insulating layer IL2. The connecting line CL and the second dummy line DFL2 may be disposed on the same layer and may include the same material as the first and second connecting lines CNL1 and CNL2 of each pixel PXL.

In some exemplary embodiments of the present disclosure, the connecting line CL disposed in the second area II of the fan-out area FTA may extend along the second direction DR2, and may be connected to the second dummy line DFL2 disposed in the first area I of the FTA. The connecting line CL and the second dummy line DFL2 may be integrally formed.

As illustrated in FIG. 14, in some exemplary embodiments of the present disclosure, the connecting line CL corresponding to the first fan-out line FL1 may be electrically connected to the first fan-out line FL1 through a second through hole TH2 passing through the second insulating layer IL2. Accordingly, the data signal applied from the data driver DDV to the first fan-out line FL1 may be applied to the connecting line CL corresponding to the first fan-out line FL1 through the second through hole TH2. The data signal transferred to the connecting line CL may be finally transferred to one data line DL of the display area DA through the connecting line CL. As a result, the same data signal may be applied to the first dummy line DFL1, the first fan-out line FL1, the connecting line CL, and the one data line DL.

As illustrated in FIG. 15, in some exemplary embodiments of the present disclosure, the connecting line CL corresponding to the second fan-out line FL2 may be electrically connected to the second fan-out line FL2 through a third through hole TH3 sequentially passing through the first and second insulating layers IL1 and IL2. Accordingly, the data signal applied from the data driver DDV to the second fan-out line FL2 may be applied to the connecting line CL corresponding to the second fan-out line FL2 through the third through hole TH3. The data signal transferred to the connecting line CL may be finally transferred to the one data line DL of the display area DA through the connecting line CL. Since the connecting line CL is integrally formed with the second dummy line DFL2, the data signal applied to the connecting line CL can be transmitted to the second dummy line DFL2. As a result, the same data signal may be applied to the second dummy line DFL2, the second fan-out line FL2, the connecting line CL, and the one corresponding data line DL.

The third insulating layer IL3 may be disposed on the connecting line CL and the second dummy line DFL2.

Since a separate photoresist pattern is added to the non-display area NDA to form the first and second dummy lines DFL1 and DFL2 in the fan-out area FTA, the density of the photoresist pattern in the non-display area NDA may be increased. Thus, the density of the photoresist pattern in the non-display area NDA may be made similar to that of the photoresist pattern in the display area DA.

After the first and second dummy lines DFL1 and DFL2 are disposed in the fan-out area FTA, the density of the photoresist pattern in the display area DA and the density of the non-display area NDA are shown in Table 1 below.

TABLE 1

| Position | First dummy line (DFL1) | | Second dummy line (DFL2) | |
|---|---|---|---|---|
| | Comparative example | Inventive example | Comparative example | Inventive example |
| Display area (DA) | 9.83% | 9.83% | 24.17% | 24.17% |
| Non-display area (NDA) | 2.18% | 14.93% | 5.70% | 21.06% |

In the comparative example, the first and second dummy lines DFL1 and DFL2 are omitted. In the inventive example, the first and second dummy lines DFL1 and DFL2 are present.

As can be seen from Table 1, when the first dummy line DFL1 is disposed in the non-display area NDA, the density of the photoresist pattern in the inventive example is higher than that of the comparative example.

Similarly, when the second dummy line DFL2 is arranged in the non-display area NDA, the density of the photoresist pattern in the inventive example is higher than that of the comparative example.

The display device according to exemplary embodiments of the present disclosure may include the first and second dummy lines DFL1 and DFL2 in the non-display area NDA, so that defects caused by the density difference of the photoresist pattern between the display area DA and the non-display area NDA may be prevented. As a result, the reliability of the display device may be increased.

Figure 16:
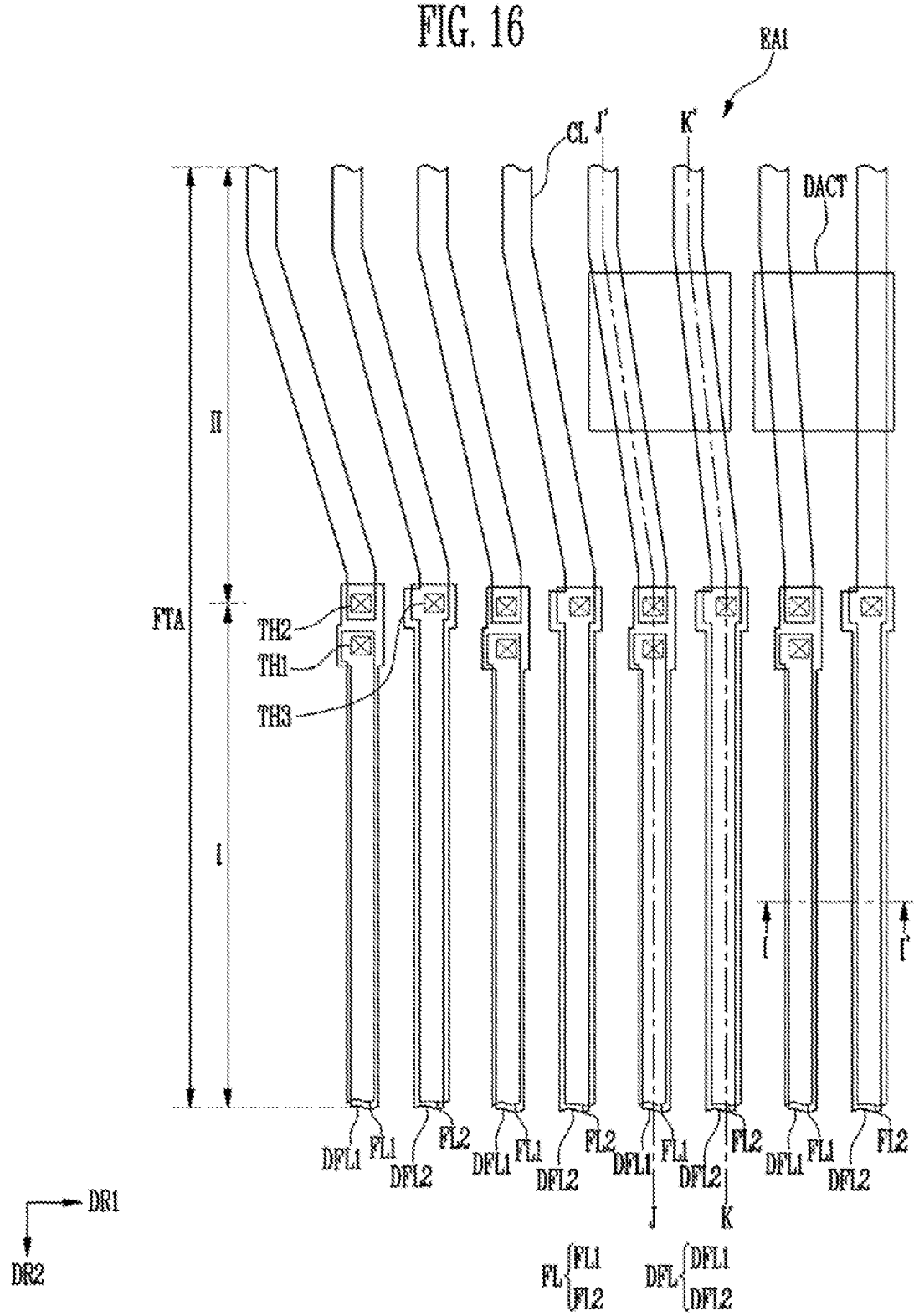
FIG. 16 is a plan view illustrating an example of a fan-out area corresponding to an area EA1 of FIG. 1.
Figure 17:
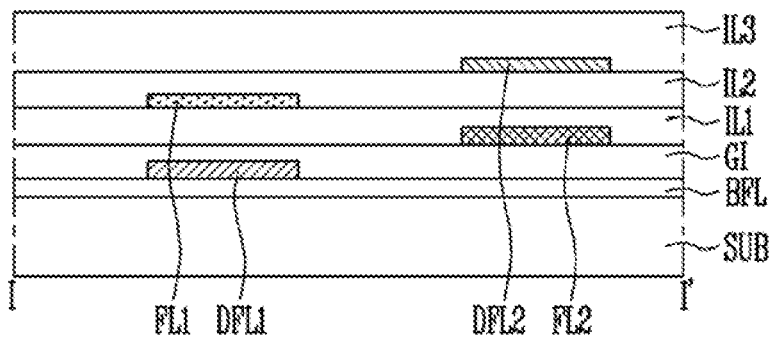
FIG. 17 is a cross-sectional view taken along section line I-I' of FIG. 16.
Figure 18:
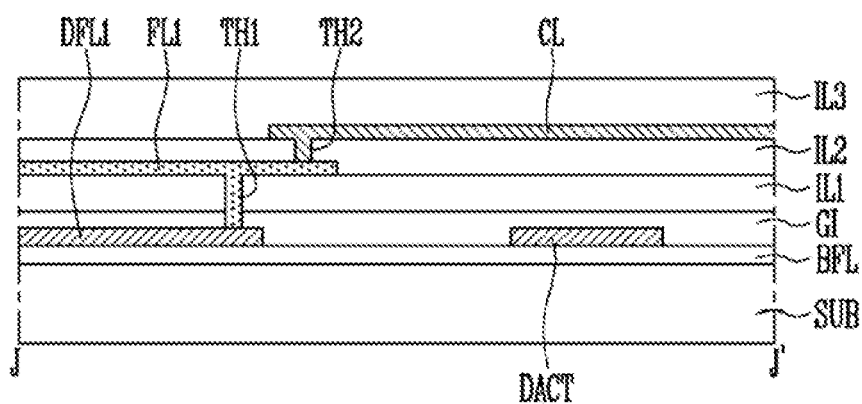
FIG. 18 is a cross-sectional view taken along section line J-J' of FIG. 16.
Figure 19:
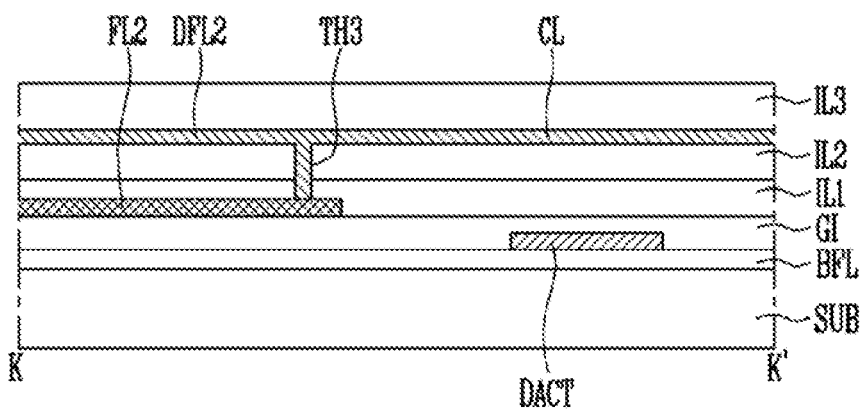
FIG. 19 is a cross-sectional view taken along section line K-K' of FIG. 16.

FIG. 16 is a plan view illustrating an example of a fan-out area corresponding to an area EA1 of FIG. 1. FIG. 17 is a cross-sectional view taken along section line I-I' of FIG. 16. FIG. 18 is a cross-sectional view taken along section line J-J' of FIG. 16. FIG. 19 is a cross-sectional view taken along section lines K-K' of FIG. 16. The same reference numerals may be used to refer to the same or like parts as those described above with respect to FIGS. 1 to 15, and to the extent that a detailed disclosure of certain elements is omitted, it may be assumed that the details are at least similar to corresponding elements that have already been described.

FIGS. 16 to 19 show the connection relationship between the lines in the fan-out area of the substrate. For convenience of explanation, a connecting line connected to the data line of the display area and a fan-out line connecting the connecting line and a driver are illustrated.

Referring to FIGS. 1 to 7, and 16 to 19, the substrate SUB may include the display area DA and the non-display area NDA.

The plurality of pixels PXL may be disposed in the display area DA. Each pixel PXL may include the first to seventh transistors T1 to T7, the light emitting element OLED connected to the first to seventh transistors T1 to T7 for emitting light, and signal lines for transmitting signals to the first to seventh transistors T1 to T7. The signal lines may include the scan lines (See Si−1, Si, Si+1 in FIG. 5), the emission control line (See Ei in FIG. 5), the data line DL, and the power line (See PL in FIG. 5), and the like.

The non-display area NDA may include the fan-out area FTA in which the plurality of connecting lines CL and the plurality of fan-out lines FL are arranged. In some exemplary embodiments of the present disclosure, the fan-out area FTA may include the second area II in which the connecting lines CL are arranged and the first area I in which the fan-out lines FL are arranged.

Each of the connecting lines CL may be a medium for electrically connecting one data line DL disposed in the display area DA and a corresponding fan out line FL.

Each of the fan-out lines FL may be a medium for electrically connecting the corresponding connecting line CL and the data driver DDV.

In some exemplary embodiments of the present disclosure, the fan-out lines FL may include the first fan-out line FL1 and the second fan-out line FL2. The first and second fan-out lines FL1 and FL2 may be disposed on different layers. The first fan-out line FL1 and the second fan-out line FL2 may be alternately arranged when viewed in a plan view.

The first fan-out line FL1 may be connected to the data line DL that is in a first pixel column in which the first pixels G emitting green color light among the pixels PXL are arranged in the second direction DR2. The second fan-out line FL2 may be connected to the data line DL that is in a second pixel column. The second pixel column may have a column having the second pixels R arranged in the second direction DR2 and a column having the third pixels B arranged in the second direction DR2. The column having the second pixels R and the column having the third pixels B may be alternately arranged in the first direction DR1.

The fan-out area FTA may further include a dummy pattern overlapping with the fan-out line FL to make the density of the photoresist pattern of the non-display area NDA similar to the density of the photoresist pattern of the display area DA.

In some exemplary embodiments of the present disclosure, the dummy pattern may include the dummy active pattern DACT, the first dummy line DFL1, and the second dummy line DFL2. In some exemplary embodiments of the present disclosure, the dummy active pattern DACT, the first dummy line DFL1, and the second dummy line DFL2 may be disposed in different layers.

The dummy active pattern DACT may be disposed in the second are II of the fan-out area FTA. The dummy active pattern DACT may be floated. When viewed in a plan, the dummy active pattern DACT may overlap the plurality of connecting lines CL.

The first dummy line DFL1 may be disposed in the first area I of the fan-out area FTA and may extend along the second direction DR2. The first dummy line DFL1 may overlap the first fan-out line FL1 when viewed in a plan view. In some exemplary embodiments of the present disclosure, the first dummy line DFL1 and the first fan-out line FL1 may be disposed on different layers. The first dummy line DFL1 and the first fan-out line FL1 may be overlapped with each other with the first insulating layer IL1 and the gate insulating layer GI disposed under the first insulating layer IL1 interposed therebetween. The first dummy line DFL1 may be disposed under the first fan-out line FL1.

The second dummy line DFL2 may be disposed in the first area I of the fan-out area FTA and may extend in the second direction DR2. The second dummy line DFL2 may overlap the second fan-out line FL2 when viewed in plan. In some exemplary embodiments of the present disclosure, the second dummy line DFL2 and the second fan-out line FL2 may be disposed on different layers, and the second dummy line DFL2 and the second fan-out line FL2 may be overlapped with each other with the first insulating layer and the second insulating layer IL2 on the first insulating layer IL1 interposed therebetween. The second dummy line DFL2 may be disposed on the second fan-out line FL2.

Hereinafter, the dummy active pattern DACT, the first and second dummy lines DFL1 and DFL2, the first and second fan-out lines FL1 and FL2, and the connecting line CL will be described referring to FIGS. 17 to 19.

First, the buffer layer may be disposed on the substrate SUB.

The first dummy line DFL1 and the dummy active pattern DACT may be disposed on the buffer layer BFL. Each of the dummy active pattern DACT and the first dummy line DFL1 may be a semiconductor pattern including polysilicon, amorphous silicon, oxide semiconductor, or the like. The dummy active pattern DACT and the first dummy line DFL1 may be formed of the same material as the first to seventh active patterns ACT1 to ACT7 included in the first to seventh transistors T1 to T7, respectively, and may be disposed on the same layer as the first to seventh active patterns ACT1 to ACT7.

The gate insulating layer GI may be disposed on the first dummy line DFL1 and the dummy active pattern DACT.

The second fan-out line FL2 may be disposed on the gate insulating layer GI. The second fan-out line FL2 may include the same material as the scan lines Si−1, Si, and Si+1, the emission control line Ei, and may be disposed on the same layer as the scan lines Si−1, Si, and Si+1, the emission control line Ei. The second fan-out line FL2 may be disposed in the same layer as the first to seventh gate electrodes GE1 to GE7 included in the first to seventh transistors T1 to T7, respectively.

The first insulating layer IL1 may be disposed on the second fan-out line FL2.

The first fan-out line FL1 may be disposed on the first insulation layer IL1. In some exemplary embodiments of the present disclosure, the first fan-out line FL1 may include the same material as the upper electrode UE of the storage capacitor Cst in each pixel PXL and be disposed on the same layer as the upper electrode UE. Also, the first fan-out line FL1 may include the same material as the initialization power line IPL in each pixel PXL and may be disposed on the same layer as the initialization power line IPL.

In some exemplary embodiments of the present disclosure, the first fan-out line FL1 may be electrically connected to the first dummy line DFL1 through the first through hole TH1 sequentially passing through the first insulating layer IL1 and the gate insulating layer GI. For example, the first fan-out line FL1 and the first dummy line DFL1 may be electrically connected. Therefore, the data signal applied from the data driver DDV to the first fan-out line FL1 may be transferred to the first dummy line DFL1 through the first through hole TH1. As a result, the same signal may be applied to the first dummy line DFL1 and the first fan-out line FL1.

The second insulating layer IL2 may be disposed on the first fan-out line FL1.

The connecting line CL and the second dummy line DFL2 may be disposed on the second insulating layer IL2. The connecting line CL and the second dummy line DFL2 may be disposed on the same layer and may include the same material as the first and second connecting lines CNL1 and CNL2 of each pixel PXL.

In some exemplary embodiments of the present disclosure, the connecting line CL disposed in the second area II of the fan-out area FTA may extend along the second direction DR2, and may be connected to the second dummy line DFL2 disposed in the first area I of the FTA. The connecting line CL and the second dummy line DFL2 may be integrally formed.

In some exemplary embodiments of the present disclosure, the connecting line CL corresponding to the first fan-out line FL1 may be electrically connected to the first fan-out line FL1 through the second through hole TH2 passing through the second insulating layer IL2.

In some exemplary embodiments of the present disclosure, the connecting line CL corresponding to the second fan-out line FL2 may be electrically connected to the second fan-out line FL2 through the third through hole TH3 sequentially passing through the first and second insulating layers IL1 and IL2.

The third insulating layer IL3 may be disposed on the connecting line CL and the second dummy line DFL2.

Since a separate photoresist pattern is added to the non-display area NDA to form the first and second dummy lines DFL1 and DFL2 and the dummy active pattern DACT in the fan-out area FTA, the density of the photoresist pattern in the non-display area NDA may be increased. Thus, the density of the photoresist pattern in the non-display area NDA may be made similar to the density of the photoresist pattern in the display area DA.

The display device according to exemplary embodiments of the present disclosure may include the first and second dummy lines DFL1 and DFL2 and the dummy active pattern DACT in the non-display area NDA, so that defects caused by the density difference of the photoresist pattern between the display area DA and the non-display area NDA may be prevented. As a result, the reliability of the display device may be increased.

The present embodiments may be applied to any display device and any system including the display device. For example, the present embodiments may be applied to a television, a computer monitor, a laptop, a digital camera, a cellular phone, a smart phone, a smart pad or tablet computer, a personal digital assistant (PDA), a portable multimedia player (PMP), a MP3 player, a navigation system, a game console, a video phone, a wearable device such as a smart watch, etc.

Therefore, the display device, according to exemplary embodiments of the present disclosure, may have increased reliability.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A display device, comprising:
    a substrate including a display area and a non-display area;
    a first insulating layer disposed on the substrate;
    a second insulating layer disposed on the first insulating layer;
    a third insulating layer disposed on the second insulating layer;
    a plurality of pixels disposed in the display area, each of the plurality of pixels including at least one transistor and a light emitting element connected to the at least one transistor;
    a data line disposed in the display area, the data line configured to supply a data signal to each of the plurality of pixels;
    a wiring portion disposed in the non-display area, the wiring portion including a connecting line connected to the data line and a fan-out line connected to the connecting line; and a dummy pattern disposed in the non-display area, the
   dummy pattern at least partially overlapping the wiring
   portion,
wherein the dummy pattern is disposed between the
   substrate and the first insulating layer,
wherein the connecting line is disposed on the third
   insulating layer, and
wherein the fan-out line is disposed between the dummy
   pattern and the connecting line.

2. The display device of claim 1, further comprising: a dummy active pattern disposed between the substrate and the first insulating layer, the dummy active pattern at least partially overlapping the connecting line.

3. The display device of claim 2, wherein the at least one transistor includes:
   an active pattern disposed on the substrate;
   a gate electrode disposed on the active pattern with the first insulating layer interposed between the active pattern and the gate electrode;
   a source electrode connected to the active pattern; and
   a drain electrode connected to the active pattern,
   wherein the dummy active pattern is disposed on a same layer as the active pattern.

4. The display device of claim 3, wherein the connecting line electrically connects the fan-out line and the data line to each other.

5. The display device of claim 4, wherein the fan-out line includes a first fan-out line and a second fan-out line disposed on different layers from each other, and wherein the first fan-out line is disposed on the second insulating layer and the second fan-out line is disposed on the first insulating layer.

6. The display device of claim 5, wherein the connecting line is disposed on the third insulating layer.

7. The display device of claim 6, wherein the first fan-out line is electrically connected to the connecting line through a first through hole passing through the third insulating layer, and wherein the second fan-out line is electrically connected to the connecting line through a second through hole passing through each of the second and third insulating layers.

8. The display device of claim 6, wherein the dummy pattern includes a first dummy line at least partially overlapping the first fan-out dummy line and a second dummy line at least partially overlapping the second fan-out line.

9. The display device of claim 8, wherein the first dummy line is disposed between the substrate and the first insulating layer, and the second dummy line is disposed on the third insulating layer.

10. The display device of claim 9, wherein the first dummy line is disposed on a same layer as the dummy active pattern, and wherein the second dummy line is disposed on a same layer as the connecting line and is integrally formed with the connecting line.

11. The display device of claim 10, wherein the first dummy line is connected to the first fan-out line through at least one contact hole that passes through the first insulating layer and the second insulating layer.

12. The display device of claim 11, wherein a same signal is supplied to the first fan-out line and the first dummy line.

13. The display device of claim 10, wherein the second dummy line is connected to the second fan-out line through at least one contact hole that passes through the second insulating layer and the third insulating layer.

14. The display device of claim 13, wherein a same signal is supplied to the second fan-out line and the second dummy line.

15. The display device of claim 9, further comprising:
   a scan line and a lower electrode disposed on the first insulating layer of each of the plurality of pixels; and
   an upper electrode disposed on the second insulating layer, the upper electrode at least partially overlapping the lower electrode to form a storage capacitor.

16. The display device of claim 15, wherein the second fan-out line is disposed on a same layer as the scan line and the lower electrode, and wherein the first fan-out line is disposed on a same layer as the upper electrode.

17. The display device of claim 16, wherein the first fan-out line and the second fan-out line are alternately arranged along one direction of the substrate.

18. The display device of claim 17, wherein the plurality of pixels includes first pixels displaying a first color, second pixels displaying a second color, and third pixels displaying a third color, and wherein the first color is green, the second color is red, and the third color is blue.

19. The display device of claim 18, wherein the first fan-out line is connected to a data line connected to the first pixels, and the second fan-out line is connected to a data line connected to the second and third pixels.

20. The display device of claim 1, wherein the dummy pattern includes:
   a dummy active pattern disposed between the substrate and the first insulating layer, the dummy active pattern at least partially overlapping the connecting line;
   a first dummy line at least partially overlapping a first fan-out line disposed on the second insulating layer of the fan-out line; and
   a second dummy line at least partially overlapping a second fan-out line disposed on the first insulating layer of the fan-out line.

21. The display device of claim 20, wherein the non-display area includes a fan-out area within which the fan-out line is disposed, and wherein the fan-out area includes a first area in which the fan-out line is disposed and a second area in which the connecting line is disposed.

22. The display device of claim 20, further comprising: a fourth insulating layer disposed on the connecting line and at least partially covering the connecting line, wherein the data line is disposed on the fourth insulating layer.

23. A display device, comprising:
   a substrate including a display area and a non-display area;
   a first insulating layer disposed on the substrate;
   a second insulating layer disposed on the first insulating layer;
   a third insulating layer disposed on the second insulating layer;
   a plurality of pixels disposed in the display area, each of the plurality of pixels including at least one transistor and a light emitting element connected to the at least one transistor;
   a plurality of data lines disposed in the display area, the plurality of data lines configured to supply a data signal to each of the plurality of pixels;
   a wiring portion disposed in the non-display area, the wiring portion including a plurality of connecting lines connected to corresponding data lines of the plurality of data lines, a first fan-out line connected to a corresponding connecting line of the plurality of connecting lines, and a second fan-out line connected to a corresponding connecting line of the plurality of connecting lines, the first and second fan-out lines being disposed on different layers; and a dummy pattern disposed in the non-display area, the dummy pattern at least partially overlapping the wiring portion, wherein the dummy pattern includes:

a dummy active pattern at least partially overlapping the connecting lines, the dummy active pattern being disposed between the substrate and the first insulating layer;

a first dummy line at least partially overlapping the first fan-out line disposed on the first insulating layer; and a second dummy line at least partially overlapping the second fan-out line, the second dummy line being disposed between the dummy active pattern and the second insulating layer.

24. The display device of claim 23, wherein the dummy active pattern and the first dummy line are disposed between the substrate and the first insulating layer, and the second dummy line is disposed on the third insulating layer.

25. The display device of claim 24, wherein the first dummy line is disposed on a same layer as the dummy active pattern, and wherein the second dummy line is disposed on a same layer as the plurality of connecting lines and is integrally formed with the each of the plurality of connecting lines.

26. The display device of claim 25, wherein the first fan-out line is disposed on the second insulating layer, and the second fan-out line is disposed on the first insulating layer.

27. The display device of claim 26, wherein the first dummy line is connected to the first fan-out line through at least one contact hole that passes through the first insulating layer and the second insulating layer.

28. The display device of claim 26, wherein the second dummy line is connected to the second fan-out line through at least one contact hole that passes through the second insulating layer and the third insulating layer.

29. The display device of claim 26, wherein the first fan-out line and the second fan-out line are alternately arranged along one direction of the substrate.

30. A display device, comprising:

a substrate having a display area and a non-display area;

a plurality of pixels disposed on the display area;

a data line disposed in the display area, the data line configured to supply a data signal to each of the plurality of pixels;

a wiring portion disposed in the non-display area, the wiring portion including a connecting line connected to the data line and a fan-out line connected to the connecting line; and a dummy pattern disposed in the non-display area, the dummy pattern at least partially overlapping the wiring portion, wherein the display area has a first pattern density, the non-display area has a second pattern density, and the first pattern density is substantially equal to the second pattern density.

31. The display device of claim 30, wherein the first pattern density represents a total area of an area of the plurality of pixels and an area of the data line, over a total area of the display area, and the second pattern density represents a total area of an area of the wiring portion and an area of the dummy pattern, over a total area of the non-display area.

32. The display device of claim 30, wherein an average thickness of the display area is substantially equal to an average thickness of the non-display area.

* * * * *